United States Patent

[19]

Solayappan et al.

[11] Patent Number: 5,997,642
[45] Date of Patent: Dec. 7, 1999

[54] METHOD AND APPARATUS FOR MISTED DEPOSITION OF INTEGRATED CIRCUIT QUALITY THIN FILMS

[75] Inventors: Narayan Solayappan; Larry D. McMillan; Carlos A. Paz de Araujo, all of Colorado Springs, Colo.

[73] Assignee: Symetrix Corporation, Colorado Springs, Colo.

[21] Appl. No.: 08/971,799

[22] Filed: Nov. 17, 1997

Related U.S. Application Data

[63] Continuation-in-part of application No. 08/653,079, May 21, 1996, abandoned, and a continuation-in-part of application No. 08/892,485, Jul. 14, 1997.

[51] Int. Cl.[6] .................................................. C23C 14/00
[52] U.S. Cl. .......................... 118/50; 118/50.1; 118/326; 118/629; 118/635
[58] Field of Search .......................... 118/50.1, 50, 627, 118/629, 634, 640, 621; 427/240, 294, 226, 425

[56] References Cited

U.S. PATENT DOCUMENTS

| | | | |
|---|---|---|---|
| 4,170,193 | 10/1979 | Scholes et al. | 118/634 |
| 5,316,579 | 5/1994 | McMillan et al. | 118/50 |
| 5,431,315 | 7/1995 | Chun et al. | 118/620 |
| 5,540,772 | 7/1996 | McMillan et al. | 118/50.1 |
| 5,585,148 | 12/1996 | Suzuki et al. | |
| 5,614,252 | 3/1997 | McMillan et al. | |

FOREIGN PATENT DOCUMENTS

| | | |
|---|---|---|
| 0 452 006 A2 | 10/1991 | European Pat. Off. |
| 0 548 926 A1 | 6/1993 | European Pat. Off. |
| 0 548 990 A2 | 6/1993 | European Pat. Off. |
| 0 736 613 A1 | 10/1996 | European Pat. Off. |
| 2 109 300 | 9/1972 | Germany. |
| WO 87/07848 | 12/1987 | WIPO. |
| WO 89/07667 | 5/1989 | WIPO. |
| WO 95/13891 | 5/1995 | WIPO. |
| WO 97/21848 | 6/1997 | WIPO. |

*Primary Examiner*—David A. Simmons
*Assistant Examiner*—Calvin Padgett
*Attorney, Agent, or Firm*—Duft, Graziano & Forest, P.C.

[57] ABSTRACT

A mass flow controller controls the delivery of a precursor to a mist generator. The precursor is misted utilizing a venturi in which a combination of oxygen and nitrogen gas is charged by a corona wire and passes over a precursor-filled throat. The mist is electrically filtered so that it comprises predominately negative ions, passes into a velocity reduction chamber, and then flows into a deposition chamber through inlet ports in an inlet plate that is both a partition between the chambers and a grounded electrode. The inlet plate is located above and substantially parallel to the plane of the substrate on which the mist is to be deposited. The substrate is positively charged to a voltage of about 5000 volts. There are 440 inlet ports per square inch in an 39 square inch inlet port area of the inlet plate directly above the substrate. The inlet port area is approximately equal to the substrate area. An exhaust port defines a channel about the periphery of an exhaust plane parallel to and below the substrate plane.

32 Claims, 12 Drawing Sheets

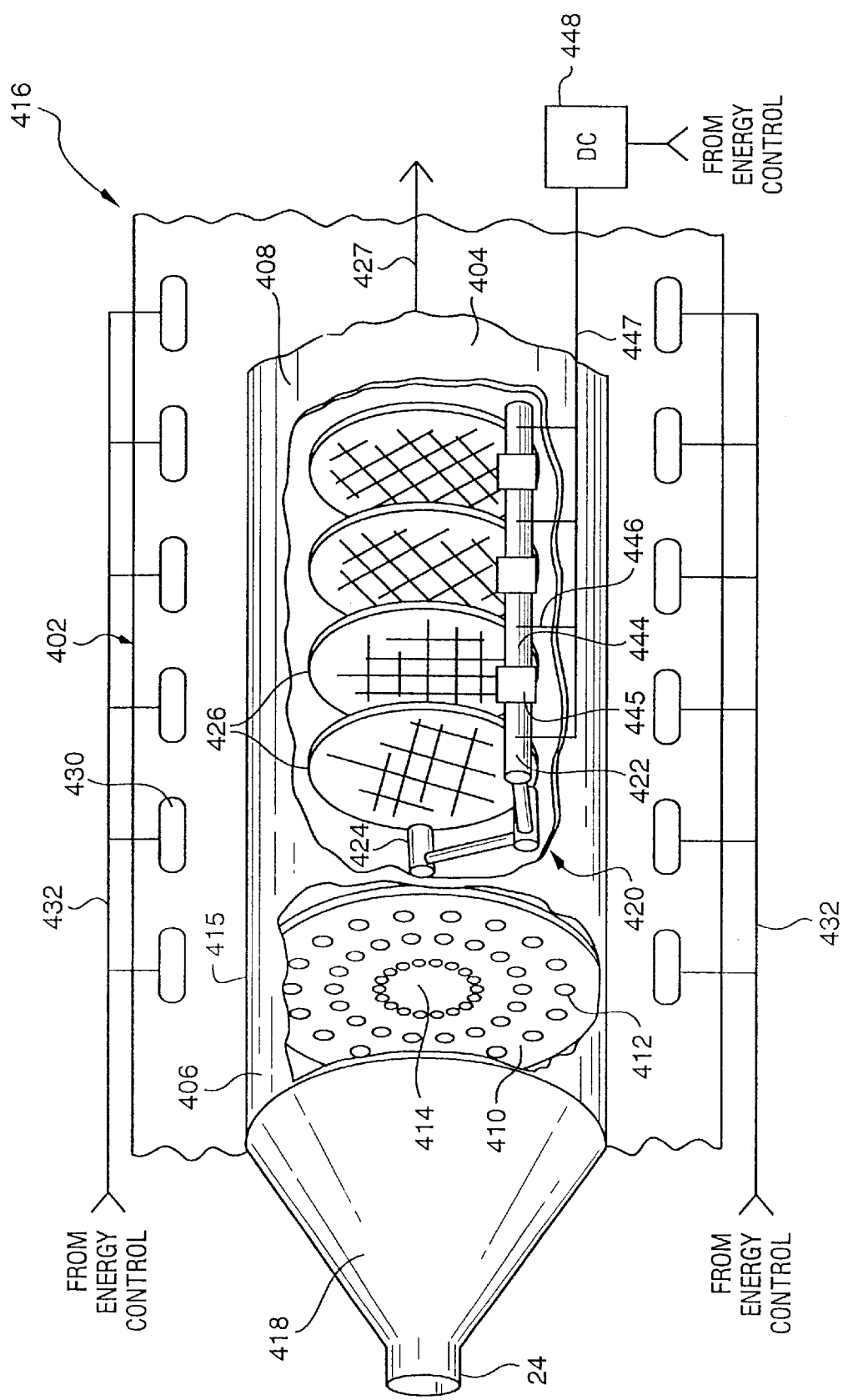

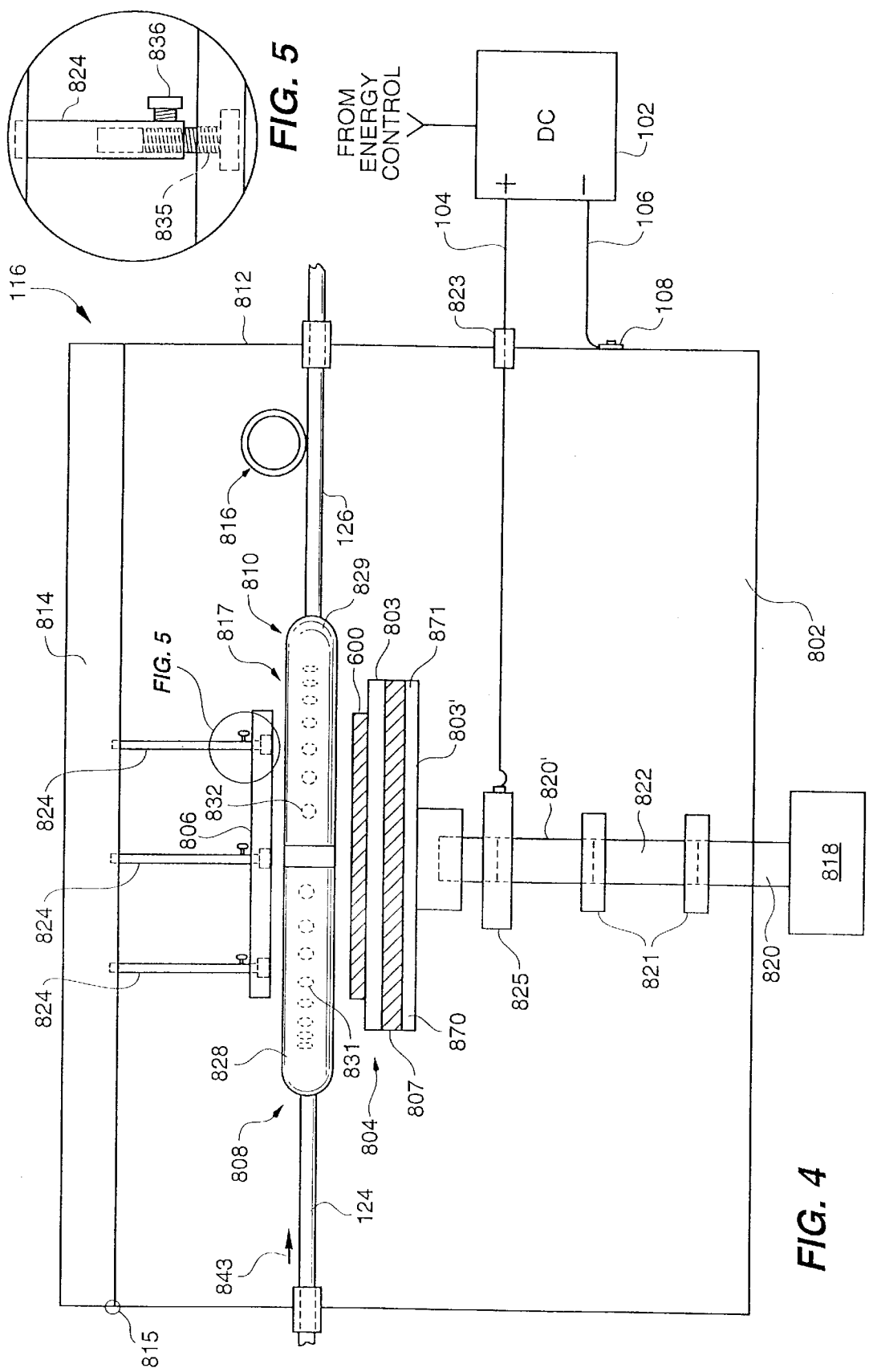

METHOD AND APPARATUS FOR MISTED DEPOSITION OF INTEGRATED CIRCUIT QUALITY THIN FILMS

This application is a continuation-in-part of U.S. patent application Ser. No. 08/653,079 filed May 21, 1996, abandoned and is also a continuation-in-part of U.S. patent application Ser. No. 08/892,485 filed Jul. 14, 1997 which applications are hereby incorporated by reference to the same extent as if fully set forth herein.

BACKGROUND OF THE INVENTION

1. Field of the Invention

The invention relates to method and apparatus for depositing thin films for use in integrated circuits by forming a mist of a liquid, and depositing the mist or a vapor formed from the mist on an integrated circuit substrate, and more particularly to such a fabrication process which increases both the step coverage and deposition rate of such a process.

2. Statement of the Problem

U.S. Pat. No. 5,456,945 issued Oct. 10, 1995 describes a method of misted deposition that has proven to provide thin films of complex materials that are of the high quality necessary for integrated circuit electronic devices. The misted deposition process also achieves deposition rates that are significantly higher then the deposition rates in other methods of depositing complex materials, such as chemical vapor deposition. One reason why the method provides high quality films is that it is a low energy process, therefore the complex organic solvents and chemical compounds that are used in the process are not carbonized or otherwise destroyed in the process. However, over extreme topological features, the misted deposition process of forming the film does not provide step coverage as good as the best alternative integrated circuit fabrication process, chemical vapor deposition. Attempts have been made to improve the step coverage by using conventional methods of adding energy used in chemical vapor deposition processes, such as heating the substrate sufficiently to significantly increase the yield. These attempts have lead to films that are carbonized, fractured and of a generally low quality that is not suitable for the fabrication of integrated circuit electronic devices. The more complex the compounds one is attempting to form, the more serious the problems. Since integrated circuit materials are tending to become more complex, and liquid source deposition processes are turning out to be the most reliable for forming thin films of very high quality, it would be highly desirable to have a liquid source deposition process that retained the high quality and high deposition rates of the lower energy misted deposition process, but at the same time was capable of the excellent step coverage available in the CVD process.

Electric fields have also been used to assist in deposition of mists. However, mists used in making electrical components for integrated materials consist of metal-organic compounds, such as alkoxides and carboxylates carried by inert gases. The gases must be inert, since otherwise they can combine with the reactive metal-organic compounds and alter the deposition process. However, both the metal-organic compounds and the inert gases do not ionize well, and thus it is difficult or impossible to use the electric field for anything more than mild poling of the mists.

SUMMARY OF THE INVENTION

The invention solves the above problem by providing apparatus and methods of depositing misted liquid precursors in a controlled manner that greatly enhances both the step coverage and the deposition rate. The invention also provides apparatus and methods of adding energy to the mist particles in a misted deposition process in a controlled manner that does not break down the chemical bonds that lead to high quality films.

The mist is created in a venturi that also ionizes the particles. An electrical mist filter is utilized to obtain a mist of predominately one polarity.

The invention utilizes a velocity reduction chamber and a "showerhead" type inlet plate located above and parallel to the substrate to provide a uniform flow of mist to the substrate. The showerhead is relatively large, preferably the area over which the ports in the showerhead are distributed being equal to or larger than the area of the substrate. Preferably, the mist enters the velocity reduction chamber in a direction substantially perpendicular to the direction the mist exits the velocity reduction chamber. The openings in the "showerhead" are as close together as possible, without affecting the mechanical stability of the showerhead, preferably 0.020 inches or less, edge-to-edge. Alternatively, they are uniformly distributed in a randomized manner.

The invention also utilizes a mist particle electrical accelerator to add energy to the particles. Oxygen is added to the mist to enhance the charging of the mist. The inlet plate acts as one electrode of the accelerator. The invention also utilizes an exhaust port that is in the form of a channel about the periphery of and below the plane of the substrate.

The invention also utilizes a mass flow controller for precisely controlling the flow of precursor liquid to the mist generator. This significantly enhances the repeatability of the deposition process.

The invention also provides apparatus and methods for deposition that result in a very fine and uniform mist; i.e. a mist in which the vast majority of the mist particles are less than a micron in diameter, and the mean particle diameter is less than half a micron.

The invention provides apparatus for fabricating an integrated circuit comprising: (a) a mist generator for forming a mist of a liquid precursor; (b) a deposition chamber; (c) a substrate holder located within the deposition chamber for supporting a substrate, the substrate holder defining a substrate plane; (d) the deposition chamber including: a mist inlet assembly in fluidic communication with the mist generator, the mist inlet assembly comprising a mist inlet plate, the mist inlet plate having a plurality of inlet ports defining an inlet plane substantially parallel to the substrate plane and distributed over an area of the inlet plate to provide a substantially uniform deposition of the mist on the substrate; (e) an exhaust port for withdrawing exhaust from the deposition chamber; and (f) the substrate plane located between the mist inlet plane and the exhaust port. Preferably, the plurality of inlet ports are distributed randomly over the area of the mist inlet plate. Preferably, the plurality of inlet ports are uniformly distributed in a randomized manner over the area of the mist inlet plate. Preferably, the area of the inlet plate over which the plurality of inlet ports are distributed is substantially equal to the area of the substrate. Preferably, the apparatus includes a velocity reduction chamber located between the mist generator and the mist inlet plate. Preferably, the mist inlet plate forms a partition between the velocity reduction chamber and the deposition chamber. Preferably, the velocity reduction chamber further comprises a velocity reduction chamber inlet port located so that mist enters the velocity reduction chamber in a direction substantially perpendicular to the direction the mist exits the velocity reduction chamber. Preferably, the inlet plate is located substantially directly above the substrate whereby gravity assists the deposition of the mist on the substrate. Preferably, the exhaust port substantially defines a channel about the periphery of an exhaust plane parallel to the substrate plane. Preferably, the deposition chamber further includes a mist particle electrical accelerator for electrically accelerating mist particles in a direction substantially perpendicular to the substrate plane, and the inlet plate comprises an electrode of the electrical accelerator. Preferably, the mist inlet plate is transparent to ultraviolet radiation. Preferably, the mist inlet plate includes a conductive coating. Preferably, the mist particle electrical accelerator comprises a first electrode substantially parallel to the substrate plane and having a plurality of mist inlet ports. Preferably, the first electrode is transparent to ultraviolet radiation. Preferably, the mist particle electrical accelerator further comprises a second electrode substantially parallel to the substrate plane and located on the opposite side of the substrate from the first electrode, and a voltage source for applying an electrical voltage to the second electrode. Preferably, the first electrode is located above the substrate plane and the second electrode is located below the substrate plane whereby the acceleration of gravity is added to the acceleration provided by the mist particle electrical accelerator. Preferably, the apparatus further includes an electrical mist filter located between the mist generator and the mist particle electrical accelerator. Preferably, the electrical voltage applied between the electrodes is between 1000 volts and 10,000 volts.

In a further aspect, the invention provides a method of fabricating an integrated circuit, the method comprising the steps of: (a) providing a liquid precursor; (b) placing a substrate inside an enclosed deposition chamber, the substrate defining a substrate plane that is substantially horizontal; (c) producing a mist of the liquid precursor containing a metal compound in a solvent; (d) flowing the mist through the deposition chamber in a substantially vertical direction perpendicular to the substrate plane and in substantially the same direction as the direction of the acceleration of gravity, to deposit a layer containing the metal on the substrate; (e) treating the layer deposited on the substrate to form a film of solid material containing the metal on the substrate; and (f) continuing the fabrication of the integrated circuit to include at least a portion of the film of solid material in a component of the integrated circuit. Preferably, the step of flowing comprises flowing the mist through an velocity reduction chamber and an inlet plate having a distribution of inlet ports to provide a substantially uniform flow of mist between the plate and the substrate. Preferably, the method further includes the step of accelerating the mist particles through an electrical field in a direction substantially perpendicular to the substrate plane during the step of flowing. Preferably, the step of producing a mist comprises providing a mist of electrically charged particles having a predominate electrical polarity and the step of flowing the mist through deposition chamber to deposit the layer on the substrate includes the step of applying an electrical potential to the substrate that is opposite in polarity to the polarity of the particles.

In yet a further aspect, the invention provides a method of fabricating an integrated circuit, the method comprising the steps of: (a) providing a liquid precursor containing a metal compound in a solvent; (b) placing a substrate inside an enclosed deposition chamber, the substrate defining a substrate plane; (c) producing a mist of the liquid precursor; (d) flowing the mist through the deposition chamber while accelerating the mist particles through an electrical field in a direction substantially perpendicular to the substrate plane to deposit a layer containing the metal on the substrate; (e) treating the layer deposited on the substrate to form a film of solid material containing the metal on the substrate; and (f) continuing the fabrication of the integrated circuit to include at least a portion of the film of solid material in a component of the integrated circuit. Preferably, the direction of acceleration of the mist particles in the electric field is substantially the same as the direction of the acceleration of gravity.

The invention solves the above problem by providing misted deposition apparatus and methods for forming and depositing mists having an average particle diameter of 0.5 microns or less.

The invention solves the problem of reliability of nebulizers that produce small particles by providing a nebulizing apparatus that has no moving parts, i.e. a venturi. In combination with the venturi, the invention provides a mist refiner which removes larger-sized particles from the mist thereby reducing the average size of the particles in the mist. The mist particle refiner is preferably an inertial separator which also operates with no moving parts.

The invention solves the problem arising from the fact that small particles tend to rebound from surfaces in two ways: first, it utilizes a venturi that also ionizes the particles, and employs an electrical accelerator to increase the energy of the particles in a controlled manner that does not break down the chemical bonds that lead to high quality films. This solution leads to another problem, the fact that a charge tends to build up on the substrate, which problem is solved by providing a substrate charge neutralizer and/or by grounding the substrate, preferably the latter. In the charge neutralizer solution, particles oppositely charged to the charge of the substrate are flowed against the underside of the substrate to neutralize the charge on the substrate without interfering with the deposition process. The solution leads to a further problem, the fact that the ionized particles of opposite charge to those which are attracted to the substrate, tend to deposit on the first electrode of the electrical accelerator. This problem is overcome by removing these ionized particles from the mist with an electrical filter.

The invention also provides a shower head type injection nozzle which enhances the even deposition of the mist. The substrate is rotated under the shower head to further enhance the even deposition of the mist.

The invention provides apparatus for fabricating an integrated circuit comprising: (a) a deposition chamber for containing a substrate; (b) a substrate holder located within the deposition chamber for supporting the substrate, the substrate holder defining a substrate plane; (c) a mist generator system for forming a mist of a liquid precursor and introducing the mist into the deposition chamber, the mist generator including a venturi; and (d) an exhaust assembly for withdrawing exhaust from the deposition chamber. Preferably, the venturi comprises a liquid vessel for holding the liquid precursor and a gas passage, the liquid vessel and the gas passage connected at a throat. Preferably, liquid vessel comprises a liquid capillary passage extending downward from the gas passage below the throat. Preferably, the apparatus further includes a mass flow controller for controlling the flow of precursor liquid into the liquid passage. Preferably, the apparatus also includes a mist refiner for reducing the average size of particles in the mist, the mist refiner located between the mist generator and the deposition chamber. Preferably, the apparatus further includes a mist charger for electrically charging the particles in the mist and a first electrode and a second electrode located in the deposition chamber for accelerating the charged mist particles. Preferably, the liquid precursor comprises a liquid selected from the group consisting of metal alkoxides and metal carboxylates. Preferably, the liquid precursor includes a solvent selected from the group consisting of methyl ethyl ketone, isopropanol, methanol, tetrahydrofuran, xylene, n-butyl acetate, octane 2-methoxyethanol, hexamethyl-disilazane, and ethanol.

In another aspect the invention provides apparatus for fabricating an integrated circuit comprising: (a) a deposition chamber for containing a substrate; (b) a substrate holder located within the deposition chamber for supporting the substrate, the substrate holder defining a substrate plane; (c) a mist generator for forming a mist of a liquid precursor; (d) a particle refiner for reducing the average size of particles in the mist, the particle inertial separator located between the mist generator and the deposition chamber, the particle refiner including a particle inertial separator; and (e) an exhaust assembly for withdrawing exhaust from the deposition chamber. Preferably, the particle inertial separator comprises: a passage for collimating the flow of the particles, the passage having an exit; and a piston for deflecting the flow of the collimated particles after they have exited the passage. Preferably, the piston comprises a stem having a substantially blunt end. Alternatively, the particle inertial separator comprises a curved mist conduit. Preferably, the mist refiner includes a particle velocity randomizing chamber for permitting the velocities of the particles to randomize. Preferably, the mist refiner includes a plurality of mist refiner stages, each stage further reducing the average size of particles in the mist. Preferably, each of the stages includes a particle velocity randomizing chamber for permitting the velocities of the particles to randomize.

In a further aspect, the invention provides apparatus for fabricating an integrated circuit comprising: (a) a deposition chamber for containing a substrate; (b) a substrate holder located within the deposition chamber for supporting the substrate, the substrate holder defining a substrate plane; (c) a mist generator system for forming a mist of a liquid precursor and flowing the mist into the deposition chamber, the mist having a mean particle size of less than 1 micron; and (d) an exhaust assembly for withdrawing exhaust from the deposition chamber. Preferably, the mean particle size of the mist is less than 0.5 microns. Preferably, the apparatus includes a particle accelerator for accelerating the particles of the mist in the deposition chamber. Preferably, the particle accelerator accelerates the particles in a direction substantially perpendicular to the substrate plane. Preferably, the particle accelerator accelerates the particles in substantially the same direction as the acceleration of gravity. Preferably, the mist generator system includes a mist generator and a mist refiner.

In a further aspect, the invention provides a method of fabricating an integrated circuit, the method comprising the steps of: (a) placing a substrate inside an enclosed deposition chamber; (b) providing a liquid precursor comprising a metal compound in a solvent; (c) utilizing a venturi to produce a mist of the liquid precursor; (d) introducing the mist into the deposition chamber to deposit a layer containing the metal on the substrate; (e) treating the layer deposited on the substrate to form a film of solid material containing the metal on the substrate; and (f) continuing the fabrication of the integrated circuit to include at least a portion of the film of solid material in a component of the integrated circuit. Preferably, the method further includes the step of reducing the average size of particles in the mist. Preferably, the step of reducing the average size of particles in the mist is performed a plurality of times. Preferably, the metal compound is selected from the group consisting of metal alkoxides and metal carboxylates. Preferably, the solvent includes a liquid selected from the group consisting of methyl ethyl ketone, isopropanol, methanol, tetrahydrofuran, xylene, n-butyl acetate, octane, 2-methoxyethanol, hexamethyl-disilazane, and ethanol.

In still a further aspect, the invention provides a method of fabricating an integrated circuit, the method comprising the steps of: (a) placing a substrate inside an enclosed deposition chamber; (b) providing a liquid precursor comprising a metal compound in a solvent; (c) producing a mist of the liquid precursor; (d) reducing the average particle size of the particles in the mist by passing the mist through an inertial separator; (e) flowing the mist into the deposition chamber to deposit a layer containing the metal on the substrate; (f) treating the layer deposited on the substrate to form a film of solid material containing the metal on the substrate; and (g) continuing the fabrication of the integrated circuit to include at least a portion of the film of solid material in a component of the integrated circuit. Preferably, the step of passing the mist through an inertial separator comprises collimating the particles in a mist passage and deflecting at least some of the collimated particles. Preferably, the step of reducing the average size of the particles in the mist comprises reducing the median size of the particles in the mist to less than 1 micron. Preferably, the step of reducing the average size of the particles in the mist to less than 1 micron comprises reducing the average size of the particles in the mist to less than 0.5 microns.

The apparatus and process of the invention not only provides deposition rates of about three to five times faster than other methods of depositing complex integrated circuit material, such as CVD, which rates are comparable to the rates of processes used in forming simple integrated circuit materials, it also provides better step coverage than the prior art misted deposition process. At the same time it retains the high quality of materials that the misted deposition process has become known for. Numerous other features, objects and advantages of the invention will become apparent from the following description when read in conjunction with the accompanying drawings.

BRIEF DESCRIPTION OF THE DRAWING

FIG. 3 is a partially cut-away view of a preferred embodiment of a tubular deposition chamber according to the invention;

FIG. 4 is a cut-away side view of the deposition chamber of the apparatus according to one embodiment of the invention;

FIG. 5 is an enlarged view of a portion of FIG. 4 showing a detail of the barrier plate support.

DETAILED DESCRIPTION OF THE PREFERRED EMBODIMENT

1. Overview and Alternative Embodiments

Figure 1:
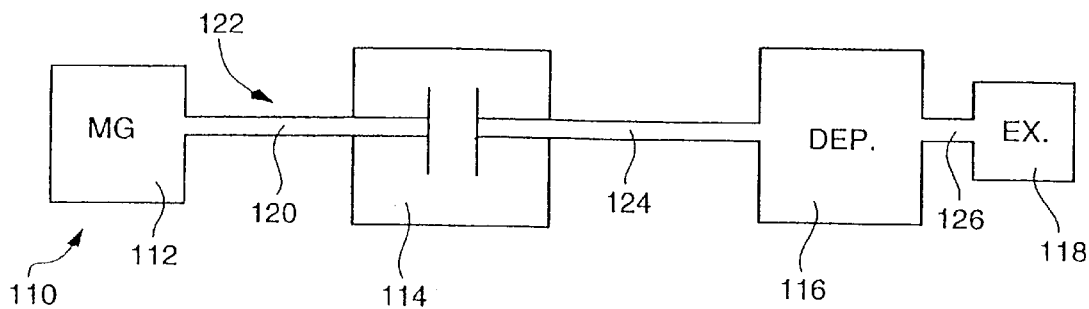
FIG. 1 is a block diagram of a preferred embodiment of the misted deposition apparatus according to the invention.

In a misted deposition process, a liquid precursor for a material such as strontium bismuth tantalate is prepared, a mist is generated from the liquids, and the mist is flowed through a deposition chamber where it is deposited on a substrate to form a thin film of the mist on the substrate. The film and substrate are then treated by UV curing, evaporation in a vacuum, and/or baking, and then annealed to form a solid thin film of the desired material, such as strontium bismuth tantalate. The basic misted deposition apparatus and process is described in detail in U.S. Pat. No. 5,456,945 issued Oct. 10, 1995 as well as numerous other publications, so it will not be described in detail herein.

As is conventional in the art, in this disclosure, the term "substrate" is used in a general sense where it includes one or a number of layers of material, such as 600 (FIGS. 13 and 18), on which the thin film may be deposited, and also in a particular sense in which it refers to a wafer 602, generally formed of silicon, gallium arsenide, glass, ruby or other material known in the art, on which the other layers are formed. Unless otherwise indicated, it means any object on which a layer of a thin film material is deposited using the process and apparatus of the invention. In the preferred embodiments herein, substrate 600 was a six-inch silicon wafer having a silicon oxide layer formed on it and a bottom electrode, such as 1120. As known in the art, integrated circuit substrates generally comprise a silicon or gallium arsenide wafer having a diameter of from 3 to 8 inches. As the technology develops larger substrates will become available. Precursor liquids generally include a metal compound in a solvent, such as sol-gel precursor formulations, which in general are comprised of metal-alkoxides in an alcohol solvent, and metallorganic precursor formulations, sometimes referred to as MOD formulations, which in general comprise a metal-carboxylate formed by reacting a carboxylic acid, such as 2-ethylhexanoic acid, with a metal or metal compound in a solvent, combinations thereof, as well as many other precursor formulations. The preferred solvents include methyl ethyl ketone, isopropanol, methanol, tetrahydrofuran, xylene, n-butyl acetate, hexamethyldisilazane (HMDS), octane, 2-methoxyethanol, and ethanol. An initiator, such as methyl ethyl ketone (MEK), may be added just before misting. A more complete list of solvents and initiators as well as specific examples of metal compounds are included in U.S. patent applications Ser. No. 08/477,111 and No. 08/478,398 both filed Jun. 7, 1995 which are hereby incorporated by reference to the same extent as if fully set forth herein.

The term "thin film" herein means a thin film of a thickness appropriate to be used in an integrated circuit. Such thin films are less than 1 micron in thickness, and generally are in the range of 200 Å to 5000 Å. It is important to distinguish this term from the same term, i.e. "thin film" as used in essentially macroscopic arts, such as optics, where "thin film" means a film over 1 micron, and usually from 2 to 100 microns. Such macroscopic "thin films" are hundreds to thousands of times thicker than integrated circuit "thin films", and are made by entirely different processes that generally produce cracks, pores and other imperfections that would be ruinous to an integrated circuit but are of no consequence in optics and other macroscopic arts.

The term "mist" as used herein is defined as fine drops or particles of a liquid and/or solid carried by a gas. The term "mist" includes an aerosol, which is generally defined as a colloidal suspension of solid or liquid particles in a gas. The term mist also includes a fog, as well as other nebulized suspensions of the precursor solution in a gas. Since the above terms and other terms that apply to suspensions in a gas have arisen from popular usage, the definitions are not precise, overlap, and may be used differently by different authors. For example, "vapor" when used in its technical sense, means an entirely gasified substance, and in this sense would not be included in the definition of "mist" herein. However, "vapor" is sometimes used in a non-technical sense to mean a fog, and in this case would be included in the definition of "mist" herein. In general, the term aerosol is intended to include all the suspensions included in the text *Aerosol Science and Technology*, by Parker C. Reist, McGraw-Hill, Inc., New York, 1983. The term "mist" as used herein is intended to be broader than the term aerosol, and includes suspensions that may not be included under the terms aerosol, vapor, or fog.

The term "electrical" herein, when referring to either the "electrical accelerator" aspect of the invention, the "electrical filter" aspect of the invention, and the "electrical charging" of the mist particles is intended to include such aspects based on either electrostatic or electromagnetic principles or both.

A block diagram of one embodiment of an improved misted deposition apparatus 110 according to the invention is shown in FIG. 1. The apparatus 110 includes a mist generator system 112, an acceleration system 114, a deposition chamber system 116 and an exhaust system 118. A first portion 120 of a mist conduit 122 connects the mist generator system 112 and the acceleration system 114, while a second portion 124 of the mist conduit 122 connects the acceleration system 114 and the deposition chamber 116. An exhaust conduit 126 connects the deposition chamber 116 and the exhaust system 118. The mist generator system 112 and exhaust system 118 are preferably as described in U.S. Pat. No. 5,456,945, which is hereby incorporated by reference to the same extent as if fully set forth herein, and therefore will not be described in detail herein.

Figure 2:
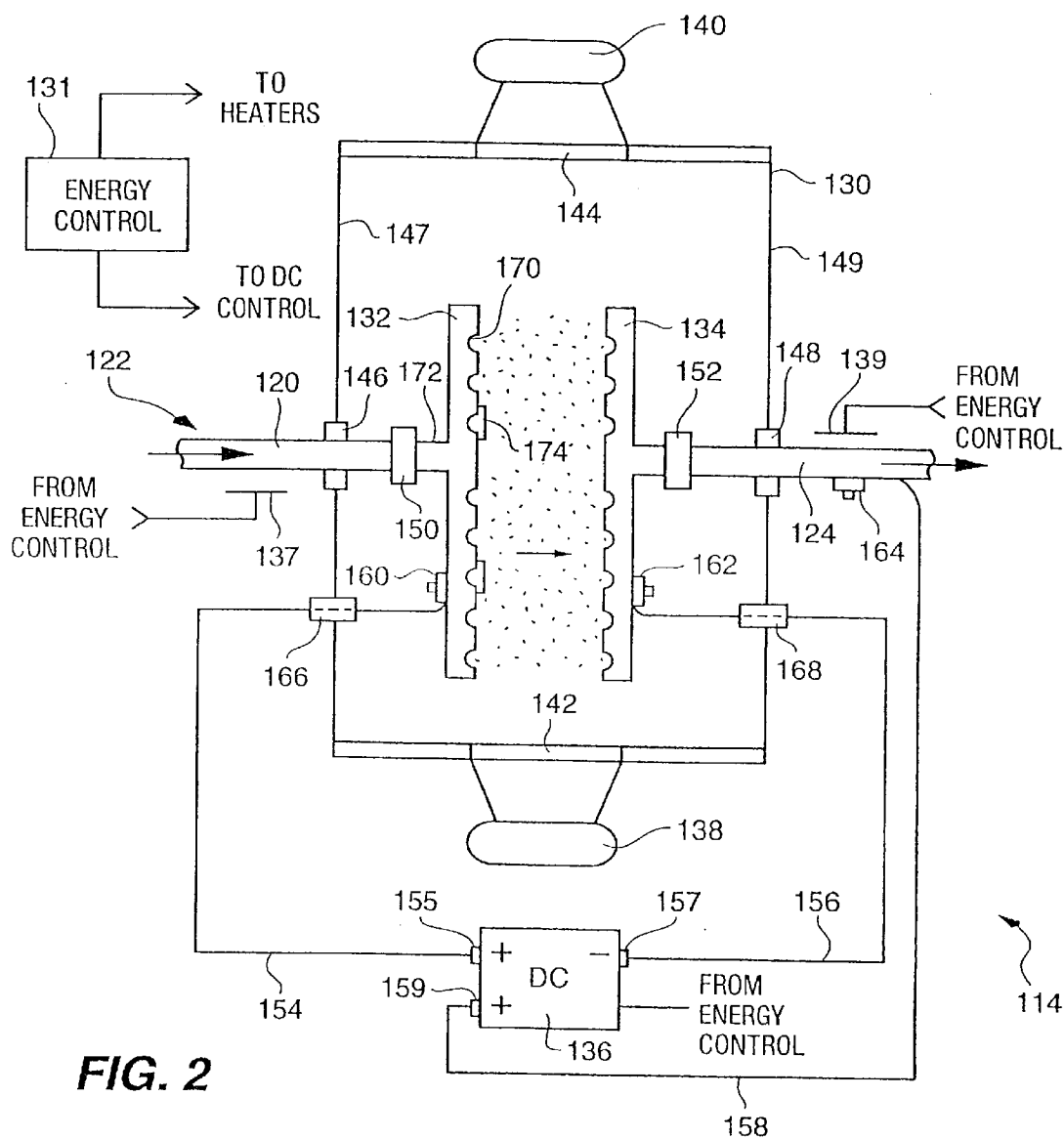
FIG. 2 is a schematic diagram of an expansion, heating and electrostatic charging chamber according to the invention.

One embodiment of the acceleration system 114 is shown in FIG. 2. It includes an acceleration chamber 130, an energy control circuit 131, a first electrode 132 a second electrode 134, a DC voltage source 136, heaters 138, which are preferably infrared lamps, and heaters 137 and 139, which are preferably resistance heaters. Acceleration chamber 130 is preferably made of quartz or other insulating material. However, it also may be made of stainless steel, aluminum, or other suitable metal. In latter case it would include quartz windows 142 and 144 and insulators 146 and 148, about the mist conduit portions 120 and 148 where they pass through acceleration chamber walls 147 and 149, respectively. Conduit 122 is preferably made of stainless steel tube but also may be made of brass alloy, aluminum or other suitable metals or other suitable materials. Electrodes 132 are preferably made of brass alloy but also may be made of aluminum or other suitably conductive material. Insulating couplings 150 and 152 connect conduit portions 120 and 124 to electrodes 132 and 134, respectively. Electrical wires 154 and 156 connect outputs 155 and 157, respectively, of DC power source 136 with electrical terminals 160 and 162, respectively, on electrodes 132 and 134, respectively. Electrical wire 158 connects electrical output 159 on DC power source 136 with electrical terminal 164 on second conduit portion 124. Insulating feedthroughs 166 and 168 pass wires 154 and 156 through chamber walls 147 and 149, respectively. referably, terminals 155 and 159 are positive output terminals and terminal 157 is a negative output terminal, though they may be oppositely charged also. Insulating couplings 150 and 152 are preferably threaded plastic couplings, such as PVC, into which the threaded ends of conduit portions 120 and 124 and electrodes 132 and 134 screw. Pass throughs 146,148 and feedthroughs 166, 168 are preferably made of an insulating plastic, such as PVC. Electrodes 132 and 134 are preferably identical and are preferably made of quarter-inch brass tubes having holes 170 formed along one side. Holes 170 are preferably threaded. Screws, such as 174, may be screwed into one or more of threaded holes 170 to adjust the flow of mist from electrode 132 to electrode 134.

FIG. 4 shows one embodiment of the deposition chamber system 116 according to the invention. This is the same as the deposition chamber described in U.S. Pat. No. 5,456, 945, and will be discussed herein only insofar as it functions in combination with the acceleration system 114. Apparatus 116 comprises a deposition chamber 802 containing a substrate holder 804, a barrier plate 806, a mist input assembly 808, an exhaust nozzle assembly 810, and an ultraviolet radiation source 816. The deposition chamber 802 includes a main body 812, a lid 814 which is securable over the main body 812 to define an enclosed space within the deposition chamber 812. The chamber is connected to a plurality of external vacuum sources 118 via exhaust conduit 126, which external vacuum sources will not be described in detail herein. Lid 814 is pivotally connected to the main body 812 using a hinge as indicated at 815. In operation, a mist and inert carrier gas are fed in through conduit 24, in direction 843, and pass through mist input assembly 808, where the mist is deposited onto substrate 600. Excess mist and carrier gas are drawn out of deposition chamber 802 via exhaust nozzle 810.

Substrate holder 804 is made from two circular plates 803, 803' of electrically conductive material, such as stainless steel, the top plate 803 being insulated from the bottom plate (field plate) 803' by an electrically insulative material, such as delrin. In an exemplary embodiment, utilizing a 4-inch diameter substrate, substrate holder 804 is nominally 6 inches in diameter and supported on a rotatable shaft 820 which is in turn connected to a motor 818 so that holder 804 and substrate 600 may be rotated during a deposition process. An insulating shaft 822 electrically insulates the substrate holder 804 and substrate 600 supported thereon from the DC voltage applied to the deposition chamber main body 812 so that a DC bias can be created between the substrate holder 804 and barrier plate 806 (via chamber main body 812). The bias of substrate 600 is preferably the opposite of the bias of electrode 132 (FIG. 2), i.e. negative in the embodiment shown. Insulating shaft 822 is connected to shaft 820 and shaft 820' by couplings 821. Electrical source 102 is operatively connected to main body 812 of deposition chamber 802 at connection 108 by lead 106 and via feedthrough 823 to brass sleeve 825 by lead 104 to effect a DC bias between field plate 803' and barrier plate 806.

Barrier plate 806 is made of an electrically conductive material such as stainless steel, and is of sufficiently large size to extend substantially over the substrate 600 in parallel thereto so that a vaporized source or mist as injected through input conduit 24 and mist input assembly 808 is forced to flow between barrier plate 806 and the substrate holder 804 over the substrate 600. Barrier plate 806 is preferably the same diameter as the substrate holder 804. The barrier plate 806 is preferably connected to the lid 814 by a plurality of rods 824 so that the plate 806 will be moved away from the substrate 600 whenever the lid is opened. The barrier plate 806 also includes a UV transmitting window (not shown in FIG. 4).

FIG. 5 shows a detail of the connection of rods 824 to barrier plate 806. Each of the rods 824 is typically a stainless steel rod attached to deposition chamber lid 814. Each rod 824 is bored to accommodate a bolt 835 by which the rod 824 is attached to barrier plate 806. Each rod 824 is tapped to accommodate a set screw 836 which secures bolt 835 to the rod 824. By loosening set screw 836, re-positioning rod 824 relative to bolt 835, and then re-tightening set screw 836, the effective length of each rod is adjustable up to ½ inch without having to remove the rod 824 from the chamber lid 814. Each of the rods 824 is removable to allow sets of rods 824 of different lengths to be substituted to coarsely adjust the corresponding spacing between barrier plate 806 and substrate holder 804 (and substrate 600) depending on the source materials, flow rate, etc. For example, the rod length may be adjusted to provide a spacing in the range of 0.10–2.00 inches. Once in place, rods 824 are also adjustable as indicated above. Thus, rods 824, bolts 835, and set screws 836 comprise an adjusting means for adjusting the barrier plate 806. The spacing between substrate holder 804 and barrier plate 806 is preferably approximately between 0.375 inches and 0.4 inches when a precursor liquid of barium strontium titanate is to be deposited.

The mist input nozzle assembly 808 and the exhaust nozzle assembly 810 are more particularly described in U.S. Pat. No. 5,456,945. Input nozzle assembly 808 includes an input conduit 124 which receives a misted solution from acceleration chamber 114 (FIG. 2) via conduit 124. Input conduit 124 is connected to arcuate tube 828 which has a plurality of small holes or input ports 831 for accepting removable screws (not shown) spaced along the inner circumference of the tube 828. Likewise, exhaust 810 comprises an arcuate exhaust tube 829 having a plurality of small holes or exhaust ports 832 with removable screws (not shown). The structure of the exhaust nozzle assembly 810 is substantially the same as that of the mist input assembly 808, except that a conduit 126 leads to a vacuum/exhaust source 118 (FIG. 1). Arcuate tube 828 of mist input nozzle assembly 808 and the corresponding arcuate tube 829 of exhaust assembly 810 respectively surround oppositely disposed peripheral portions 870 and 871, respectively, of substrate holder 804. Substrate holder 804, barrier plate 806, input assembly 808 and exhaust nozzle assembly 810 collectively cooperate to define a relatively small, semi-enclosed deposition area 817 surrounding an upper/exposed surface of the substrate 600, and within which the vaporized solution is substantially contained throughout the deposition process. As discussed in detail in U.S. Pat. No. 5,456,945, a key aspect of the apparatus shown in FIGS. 4 and 5 is that the mist is flowed across the substrate via multiple input ports 831 and exits the area above the substrate via multiple exhaust ports 832, with the ports being distributed in close proximity to and about the periphery of the substrate 600 to create a substantially evenly distributed flow of mist across the substrate 600 in a direction substantially parallel to the substrate plane to form a film of the liquid precursor on the substrate 600.

FIG. 3 shows an alternative embodiment of a deposition chamber system 416 in accordance with the invention. It includes an outer housing 402 that does not need to be vacuum tight, and an inner tubular chamber 404 that is vacuum tight. Inner chamber 404 includes an expansion chamber portion 406 and a deposition chamber portion 408 that are separated by a partition 410 having a plurality of bores 412 through it that allow the mist to pass. Preferably, there are no bores formed in the area 414 that is near the axis of the conduit 124 and tubular chamber 408 which prevents streaming of the mist directly from conduit 124 into chamber 408. Expansion chamber 406 includes a tubular portion 415 and a cone-shaped portion 418 that connects conduit portion 124 with the tubular portion 415. Mounted within tubular deposition chamber 408 is a cradle 420 formed of three interconnected wafer supports, such as 422. Each wafer support has a series of notches, such as 424, formed in it into which the edges of a plurality of substrates 426 fit to hold the substrates in a position substantially perpendicular to the axis 427 of chamber 408. An arrowhead has been placed on axis 427 to show the direction of mist flow in the chamber 408. In one embodiment one or more of the wafer supports 422 is made of conducting members, such as 444, connected by insulating couplings, such as 445. In this embodiment, each conducting member 444 is separately connected to a wire, such as 446; the wires 446 are bundled into cable 447 which connects to DC source 448 which is controlled by energy control 131 (FIG. 2). Mounted within housing 402 are a plurality of heating elements 430, which preferably are infrared lamps. Each of lamps 430 is connected via a cable 432 to energy control circuit 131 (FIG. 2). Energy control circuit 31, conducting members 444, cables 447 and 432, and heating elements 430 form a differential energy source that allows energy to be added to the mist in different amounts in different positions along the direction of mist flow during the deposition process. Preferably, the energy added at each position, either by the additional electric field provided via a conducting member 444 along tubular chamber 408 or additional heat energy provided via a heater 430 along tubular chamber 408, is substantially in an amount required to provide uniform deposition of the mist on the plurality of substrates. Generally, this is done by adding just enough energy at each position to make up for the energy lost by the mist as it travels down the tubular chamber 408. That is, the energy added is just enough to keep the average energy of the mist particles constant as the mist travels down chamber 408.

Tubular chamber 404 is preferably formed of glass or a plastic that is transparent or at least translucent to infrared radiation. Housing 402 is preferably made of stainless steel, aluminum, or other suitable material.

The invention is operated as follows. Mist particles travel from mist generator 112 through mist conduit portion 120 to electrode 132. Mist conduit 120 may be heated to a temperature slightly above the temperature of the mist, to prevent the mist from condensing out on the conduit. Such condensation both decreases the energy of the mist and causes mist particles to increase in size, which can create defects in the thin film deposited. The amount of energy applied is controlled by mist control circuit 131. The energy applied by mist generator 12 is sufficient to strip some electrons from some mist particles charging them. Additional electrons are stripped from the mist particles when emerging from electrode 132 by the positive voltage on electrode 132, or in other words, the energy of the electric field between electrodes 132 and 134. The charged particles accelerate toward the negatively charged electrode 134. Collisions between mist particles can strip further electrons and further charge the particles. However, the energy added by the field between the electrodes 132 and 134 is kept low enough so that neither the organic bonds in the precursor solution are broken nor is the precursor solvent broken down. The non-charged particles move from the first electrode to the second electrode 134 as well as the charged particles because there is a pressure differential between the electrodes created by the exhaust system 118. As they move through acceleration chamber 114 and from acceleration chamber 114 into deposition chamber 116, the non-charged particles will pick up energy due to collisions with the charged particles. Further, all particles pick up energy from heaters 140. Thus, all particles, charged, and non-charged are accelerated. It is important to recognize that while in some of the embodiments described herein, including the preferred embodiment, the electric field between the electrodes accelerates the mist generally in the direction of flow of the mist, the direction of acceleration, while important, is not as important as the fact that the particles are accelerated. It should further be understood that the term acceleration here means absolute acceleration; that is, the speed of the particles increases. While the velocity (speed with a direction attached) increases more in the direction of the electric field, the particular direction of the increase is not as important at the fact that energy is added to the mist.

After being accelerated in acceleration chamber 114, the mist particles pass in to conduit portion 124. Conduit portion 124 is preferably heated by a resistance heater to prevent the particles from losing energy due to collisions with the conduit walls. Preferably, the heating is just slightly higher, i.e. about 110 degrees or so, above the temperature of the mist, so as not to break down the bonds of the precursor compounds and solvent. Turning to FIG. 4, the mist is then flowed through deposition chamber 116. Preferably, the substrate 600 is held at a polarity that is opposite to the polarity of the mist, thereby further increasing the energy of the particles. Barrier plate 806 is held at the opposite polarity to repel the particles toward the substrate. Thus, a field between the barrier plate and the substrate increases the energy of the particles. Again, the increase is small, below the amount which would cause organic bonds desirable in the final thin film to break.

If the deposition chamber system 416 is used, the mist particles enter expansion chamber 406, which is sufficiently large to allow the particles to distribute themselves substantially uniformly throughout the chamber before they move through bores 412 into deposition chamber 408. Expansion chamber 406 is also preferably long enough so that particles that are so large as to potentially cause defect problems fall under the influence of gravity to a position below the substrates 426. This chamber has several advantages over the chamber of FIG. 4. First, multiple substrates may be deposited at once, increasing the yield. Further, large particles, which may result in defects in the final thin film, tend to sink to the bottom of expansion chamber 406 and deposition chamber 408, thus do not deposit on the substrates. This results in a finer particle distribution and better step coverage. As the mist deposits on the substrates 426, the average mist energy goes down. However, the heaters and electrodes, under control of the energy control 131 add energy to the mist, so the average rate of deposition does not decrease from the first of the substrates to the last.

During, after, or both during and after deposition, the precursor liquid is treated to form a thin film of solid material 1122 (FIG. 18) on the substrate 600. In this context, "treated" means any one or a combination of the following: exposed to vacuum, ultraviolet radiation, electrical poling, drying, and heating, including baking and annealing. In the preferred embodiment, UV radiation is optionally applied to the precursor solution during deposition. The ultraviolet radiation is preferably also applied after deposition. After deposition, the material deposited on the substrate, which is liquid in the preferred embodiment, is preferably exposed to vacuum for a period, then is baked and then annealed. The preferred process of the invention is one in which the misted precursor solution is deposited directly on the substrate and the dissociation of the organics in the precursor that do not form part of the desired material and removal of the solvent and organics or other fragments takes place primarily after the solution is on the substrate. However, in another aspect the invention also contemplates a process in which the final desired chemical compound or an intermediate compound is separated from the solvent and organics during the deposition and the final desired chemical compound or an intermediate compound is deposited on the substrate. In both aspects, preferably, one or more bonds of the precursor pass through to the final film. After the formation of the solid thin film of the desired material 1122 (FIG. 18), such as barium strontium titanate, strontium bismuth tantalate and other such materials, the integrated circuit 1100 is continued to completion. The fabrication of the integrated circuit 1100 is such as to preferably include at least a portion of the material, such as 1122, deposited by the apparatus and process of the invention in an active electrical component of the integrated circuit.

In the above description, one example of the process according to the invention has been disclosed in which the mist, as a whole, flows into and through the deposition chamber in a direction essentially parallel to the substrate plane, i.e., the embodiment of FIG. 4, and another example of the process according to the invention has been disclosed in which the mist flows into and through the deposition chamber in a direction essentially normal to the substrate plane, i.e., the embodiment of FIG. 3. It is clear that there is movement of individual mist particles in directions different than the general flow of the mist, since otherwise there would be no deposition at all in the case of the embodiment of FIG. 4, and there would be deposition only on the first of the wafers in the embodiment of FIG. 3. It is contemplated by the invention that the direction of the mist introduction into the deposition chamber can be any direction between the direction of FIG. 4 and the direction of FIG. 3. That is the mist, as a whole, may be introduced into and flow through the deposition chamber in any direction relative to the substrate plane, including at an angle to the substrate plane.

In both embodiments described to this point, the acceleration chamber is a separate chamber from the deposition chamber. However, the invention contemplates that the acceleration electrodes may share the same chamber with the mist input assembly 808 and the exhaust assembly 810. Depositions have in fact been successfully accomplished using the barrier plate 806 as one electrode 132 and the substrate 600 as the other electrode 134. However, the preferred embodiment, to be described in detail below, is one in which the acceleration electrodes are part of the deposition chamber and neither is electrically connected to the substrate.

2. The Preferred Embodiment

Figure 6:
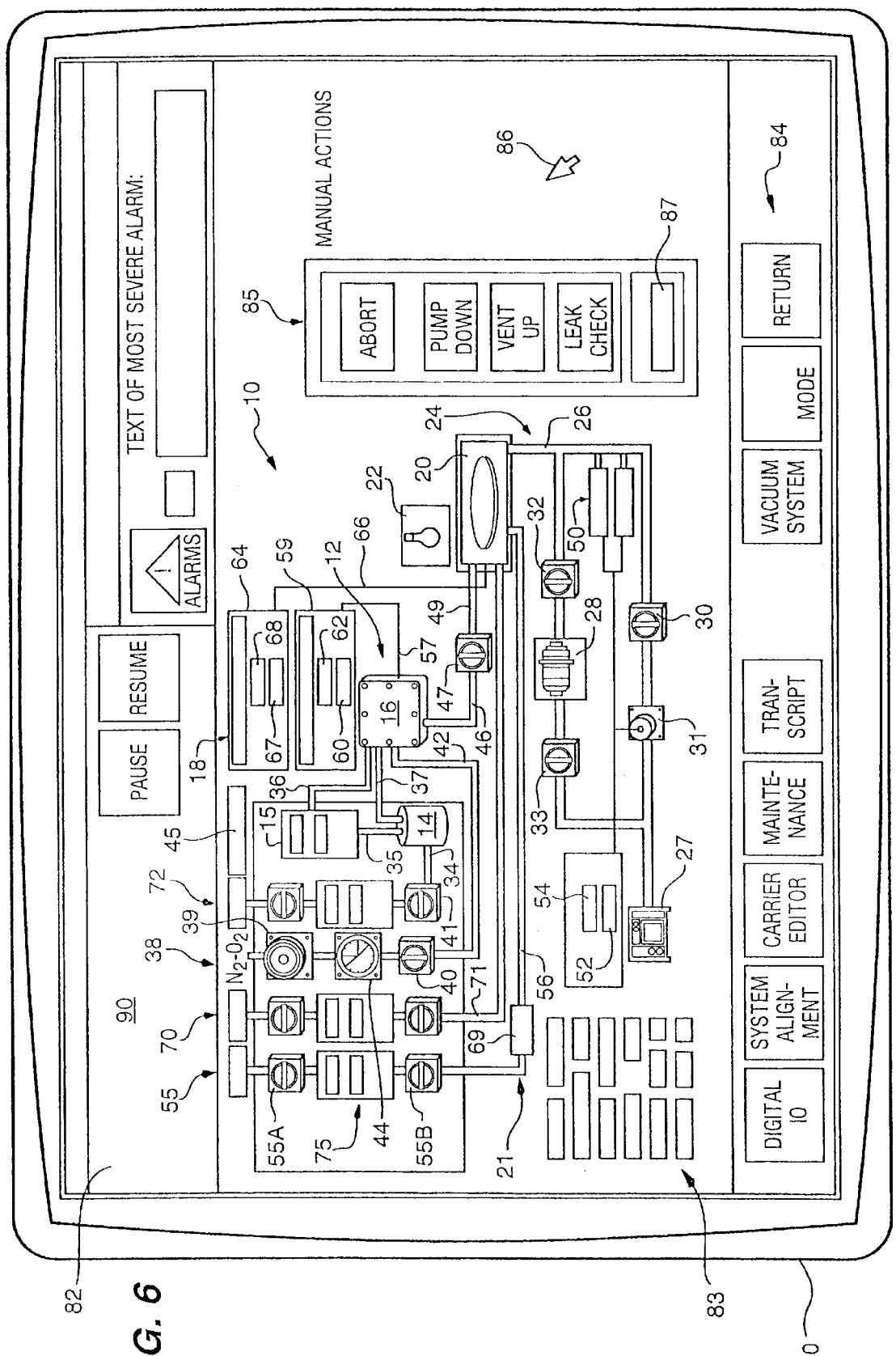
FIG. 6 shows the main menu of the computer program used to operate the system according to the invention, which menu includes a block diagrammatic illustration of the misted deposition system according to the invention.

FIG. 6 shows a computer display 80 on which is shown the main menu 82 of a computer program that forms part of the misted deposition system 10 according to the invention. This menu 82 includes a block diagram of the preferred embodiment of the improved misted deposition apparatus 10. The computer system and program, and this menu 82 in particular, allows the operator to control each pump, valve, and other control of the system simply by inserting a value in an appropriate box, such as 52, using a mouse to place the cursor 86 on an appropriate valve, such as 31, or other control, and clicking the mouse. We shall not describe the details of the computer system and program herein, as the details are not part of the invention claimed herein. However, the misted deposition apparatus 10 diagramed on the screen 90 does form a part of the invention, and the screen is useful in providing an overview of the system and its operation. The apparatus 10 includes a mist generator system 12, which in the preferred embodiment comprises a pressurized reservoir 14, a mass flow controller 15, and a nebulizer/mist refiner 16 (FIGS. 7–12), an acceleration system 18 (FIGS. 6, 9–10, 13, and 16), a deposition chamber system 20, a charge neutralizer system 21, an ultraviolet and infrared heating system 22, and an exhaust system 23.

As indicated in the Overview, Section 1 above, in a misted deposition process, a substrate 600 is first prepared for deposition by pretreatment. Here, "pretreatment" preferably comprises exposure to UV radiation, but may also include exposure to infrared radiation, a bake at a temperature between 300° C. and 900° C., and/or exposure to vacuum. A precursor for a material, such as a metal oxide, is prepared or provided, a mist is generated from the liquid, and the mist is flowed through a deposition chamber 632 (FIG. 16) where it is deposited on a substrate 600 (FIG. 13) to form a thin film of the mist on the substrate. The film and substrate are then treated by UV curing, evaporation in a vacuum, and/or baking, and then annealed to form a solid thin film of the desired material. In this section, we shall briefly describe the flow of the liquid precursor through the system to present an overview of the system and its operation. To begin the process, the liquid precursor is inserted in pressurized reservoir 14 while the deposition chamber system 20 is being pumped down via exhaust line 26, roughing pump 27 and, optionally, turbo pump 28. As known in the art, roughing pump 27 is turned on, roughing valve 30 is opened, throttle valve 31 is first partially opened, then gradually opened all the way as roughing pump 27 reduces the pressure in deposition chamber system 20 to the deposition pressure or below a pressure where turbo pump 28 can operate efficiently. Optionally, turbo foreline valve 33 is opened, turbo pump turned on, turbo iso valve 32 is opened, and roughing valve 30 closed and the deposition chamber is pumped down to about $10^{-6}$ Torr to throughly purge it of any possible contaminating gases. Gas system 72 provides pressurized gas, preferably dry nitrogen or other inert gas, via line 34 to precursor reservoir 14 at sufficient pressure to drive the fluid from reservoir 14 to mass flow controller 19. Reservoir 14 is pressurized by opening valve 41. Pressurized reservoir 14 is connected to mass flow controller 15 via line 35, and mass flow controller 15 is connected to nebulizer/mist refiner 16 via line 36. As known in the fluid control art, a mass flow controller 15 is an electronic device that accurately passes a selected mass of liquid. Unlike a valve, the flow of liquid through a mass flow controller does not depend on the pressure of the fluid flow line, the viscosity of the liquid, or the numerous other parameters that can affect fluid flow. The desired mass flow in cubic centimeters per minute is set in the bottom of the two boxes shown on the controller, and the exact mass flow being delivered is read out in the top one of the two boxes. The liquid mass flow controller 15 is should be capable of accurately controlling flow of a liquid to within 2% of the selected flow rate. Preferably, the liquid mass flow controller 15 is a controller model No. LV410 manufactured by STEC (a Japanese Corporation) and distributed in the USA by Horiba Instruments, Inc. of San Jose, Calif. This mass flow controller 15 can control the flow of precursor into nebulizer/mist refiner 16 from about 0.05 ccm (cubic centimeters per minute) essentially up to 1 ccm. The mass flow controller 15 permits minute adjustments of the flow of precursor liquid into nebulizer 300 (FIGS. 10 and 11) and also permits the same flow to be repeated in later runs. The use of a mass flow controller 220 is very important to obtain repeatable deposition rates. It also enables one to avoid recirculating the precursor, which as indicated below, effects the repeatability and quality of the deposition. The liquid precursor moves through inlet tube 36 to nebulizer/mist refiner 16. Optionally, return tube 37 brings precursor that is not misted or condenses out in mist generator nebulizer/mist refiner 16 back to reservoir 14. In the preferred embodiment of the invention, there amount of precursor that is not misted and condenses out is relatively small, i.e. about 20% or less of the total precursor, and thus the condensate is simply disposed of by purging nebulizer/refiner 16 after deposition, rather than reusing it. This prevents potential problems such as thickening of the precursor. Valves 39 and 40 are then opened to send pressurized gas flowing through gas line 42 to nebulizer/mist refiner 16, with the gas pressure in line 42 automatically controlled via the computer (only display 80 shown) via pressure gauge 44 to a preset pressure entered in box 45. Preferably this pressure is between 40 pounds per square inch (psi) and 80 psi, and most preferably about 60 psi. Preferably the gas is a mixture of an inert gas, such as dry nitrogen, and an easily ionized gas, preferably oxygen or carbon dioxide, and most preferably oxygen. The oxygen is added to enhance the charging of the mist. The oxygen ionizes readily, and, since, in a gas at room temperature the gas particles are continually colliding, assists in transferring charge to the liquid mist droplets. Preferably the gas is 1% to 15% oxygen in volume, and most preferably 5% to 10%. In the preferred embodiment process, 95% dry nitrogen and 5% oxygen was used. Gas line 42 is connected to gas passage 464 in nebulizer/mist refiner 16 (FIG. 11), and the precursor liquid is drawn into the nebulizer/refiner 16 by the capillary action in vessel 462 (FIG. 11) and the gas flowing through gas passage 464.

To begin the deposition process, valve 47 is opened to permit the mist generated in nebulizer/mist refiner 16 to flow into deposition chamber 20 via conduit 49. Valve 32 is closed and valves 30 and 31 are opened, since the deposition takes place near atmospheric pressure. The pressure in deposition chamber system 20 is allowed to rise until it is in a pressure range of from 10 Torr to atmospheric pressure, and most preferably about 300 Torr below atmospheric. The pressure is automatically controlled via sensors 50, throttle valve 31, and the computer, to a pressure entered in box 52. The pressure in exhaust line, and thus deposition chamber system 20, is read out in box 54. Preferably the gas/mist flow through the system from line 42, through venturi gas passage 464 and inlet plate 682 to exhaust line 26 is between 3 liters per minute and 8 liters per minute, and preferably about 5 liters per minute.

Figure 17:
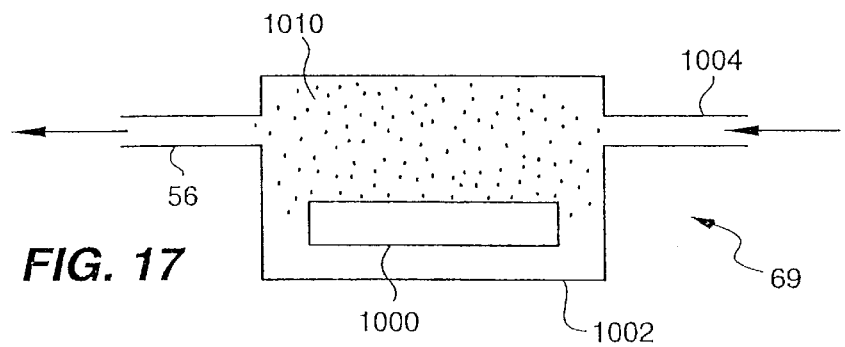
FIG. 17 is a block-diagrammatic cross-sectional view of the ionized particle generator portion of the charge neutralizer according to the invention.

As will be described in more detail below, a power line 57 runs to mist generator 12 to either apply voltage to electrically filter the mist, to charge the mist, or both. The voltage applied in mist generator 12 is automatically controlled by power generator 59 and computer 59 to a voltage or voltages entered in box 60. The applied voltage(s) is read out in box 62. Similarly, the charged particles are accelerated in deposition chamber 20 by means of a voltage applied from power source 64 via electrical cable 66. The acceleration voltage is automatically controlled by the computer via power source 64 to a voltage entered in box 67. The applied voltage is read out in box 68. Optionally, charged particles with a charge opposite to that of the mist particles depositing on substrate 600 are generated by charge neutralizer system 21 which includes an ionized particle source 69 (FIG. 17). Supply valve 55A is opened and then iso valve 55B in gas system 55 is controlled by the computer to produce a gas flow through ionized particle source 69 and gas line 56 to carry the ionized particles to deposition chamber 20 where they are directed at the substrate 600. In the preferred embodiment, the charge neutralizer system 21 is not used. Instead, gas system 55 is used to direct dry nitrogen against the underside of the substrate 611, to prevent precursor from depositing on the underside of the substrate. Gas system 55 may also be controlled to admit additional dry nitrogen or other inert gas into deposition chamber system 20 via gas line 56 if this is needed to maintain the pressure at the desired level. Additional oxygen or carbon dioxide may also be added if needed to assist in charging the mist.

After the deposition is completed, valves 47 and 40 are closed to stop the flow of mist to the chamber 632, and the thin film on the substrate 600 may be cured and baked in situ via ultraviolet and or infrared lamps in heating system 22. This is made possible by the fact that the inlet plate 682 freely passes ultraviolet and infrared radiation, either because area 687 is mostly open space, or because the plate 682 is made of material that is essentially transparent to ultraviolet and infrared radiation. By "in situ" is meant that the substrate is not removed from the deposition chamber during this process. Preferably, the initial drying step takes place without breaking vacuum. This is important, because the high electronic quality of the thin film layer 1122 (FIG. 18) is compromised by breaking vacuum and exposure to contaminates prior to drying. The substrate 600 (FIG. 13) may also be removed from the deposition chamber and transferred to an annealing station without breaking vacuum. An example of these curing, baking, and annealing steps is given below. Additional substrates may be placed in and removed from the deposition chamber 632 without breaking vacuum. After all deposition processes have been completed, valve 32 is opened and the system is pumped down to clean it. If desired, the system may be purged with dry nitrogen or other inert gas via valves 70 and purge line 71. In each of the gas systems 55, 70 and 72 the pressure in the corresponding gas line is automatically controlled by the computer to a pressure entered in the lower of the two boxes 75, and the actual pressure is read out in the upper one of the two boxes.

The boxes 83 are used to program the computer to automatically run a predetermined process. Each predetermined process may be given a recipe name which is entered in the top one of the boxes to invoke the process. Elements of the process that are shown in other boxes as the process proceeds are the total number of steps in the process, the name of the particular steps being performed, step number of the step being performed, the time of the step being performed, and the time of the process being performed. The various buttons 84 and 85 bring up additional screens which allow one to perform various system functions. The digital IO button allows the valves to be manually controlled. The system alignment button allows a robot that handles the wafer to be manually controlled. The carrier editor button allows one to enter data regarding the wafer, such as its dimensions, which is used by the robot. The maintenance button brings up a maintenance menu, the transcript button brings up a menu that allows one to enter and read status and process information, the mode button allows one to switch between a service mode, the automatic mode and an offline mode. The return button takes one back to the main menu. Buttons 85 allow one to manually control the indicated functions. The chamber state, i.e. atmospheric, vacuum, etc. is always shown in box 87 for quick reference.

The individual portions of the gas sources 55, 70, 72, the UV heating system 22, and the exhaust system 24 are well-known in the art and will not be described in further detail herein. The heart of the invention is contained in the mist generator system 12, the deposition chamber system 20, the acceleration system 18, the charge filter system 240 (FIG. 10), and the charge neutralizer system 21, which will described in further detail below.

Figure 18:
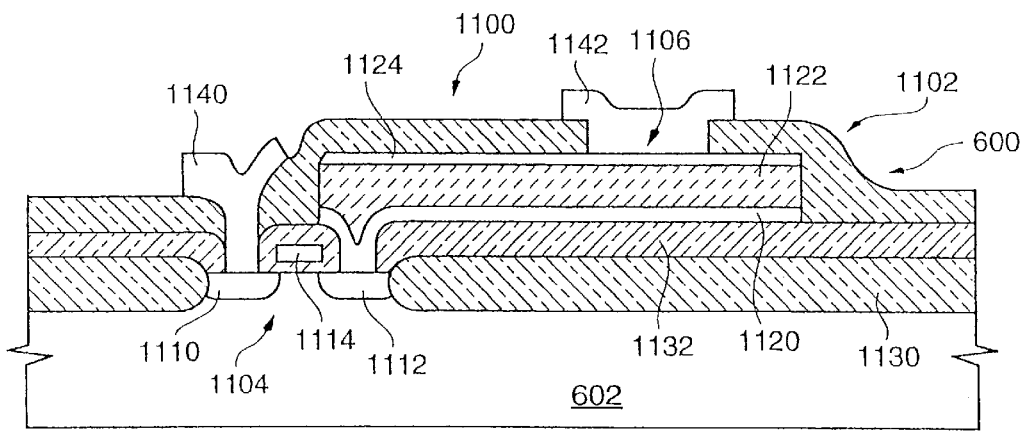
FIG. 18 is a cross-sectional view of an exemplary integrated circuit as may be made by the apparatus and methods of the invention.

FIG. 18 shows an example of a portion of an integrated circuit 1100 as may be fabricated by the apparatus and methods of the invention. This particular circuit portion is a single memory cell 1102 of a 1T/1C (one transistor/one capacitor) DRAM that is a well-known integrated circuit in the art. Cell 1102 is fabricated on a silicon wafer 602 and includes a transistor 1104 and a capacitor 1106. Transistor 1104 includes a source 1110, a drain 1112, and a gate 1114. Capacitor 1106 includes a bottom electrode 1120, a dielectric 1122, and a top electrode 1124. Field oxide regions 1130 formed on the wafer 602 separate the various cells in the integrated circuit, and insulating layers, such as 1132, separate the individual electronic elements, such as transistor 1104 and capacitor 1106. The bottom electrode 1120 of capacitor 1106 is connected to the drain 1114 of transistor 1104. Wiring layers 1140 and 1142 connect the source of the transistor 1104 and the top electrode of capacitor 1106, respectively, to other portions of the integrated circuit 1100. The method of the invention has been used to deposit the dielectric material 1122, though it also may be used to deposit other elements of the circuit, such as insulator 1120. In the case where the process is used to deposit the material 1122 the immediate substrate 600 on which the material 1122 is deposited is the bottom electrode 1122, but more generally may be thought of as the incomplete integrated circuit, including wafer 602 and layers 1130,1132 and 1120 on which the material 1122 is deposited. The method of the invention has also been used to deposit a ferroelectric, such as strontium bismuth tantalate, as the material 1122. In this case, the integrated circuit is an FERAM, or ferroelectric memory cell.

Figure 7:
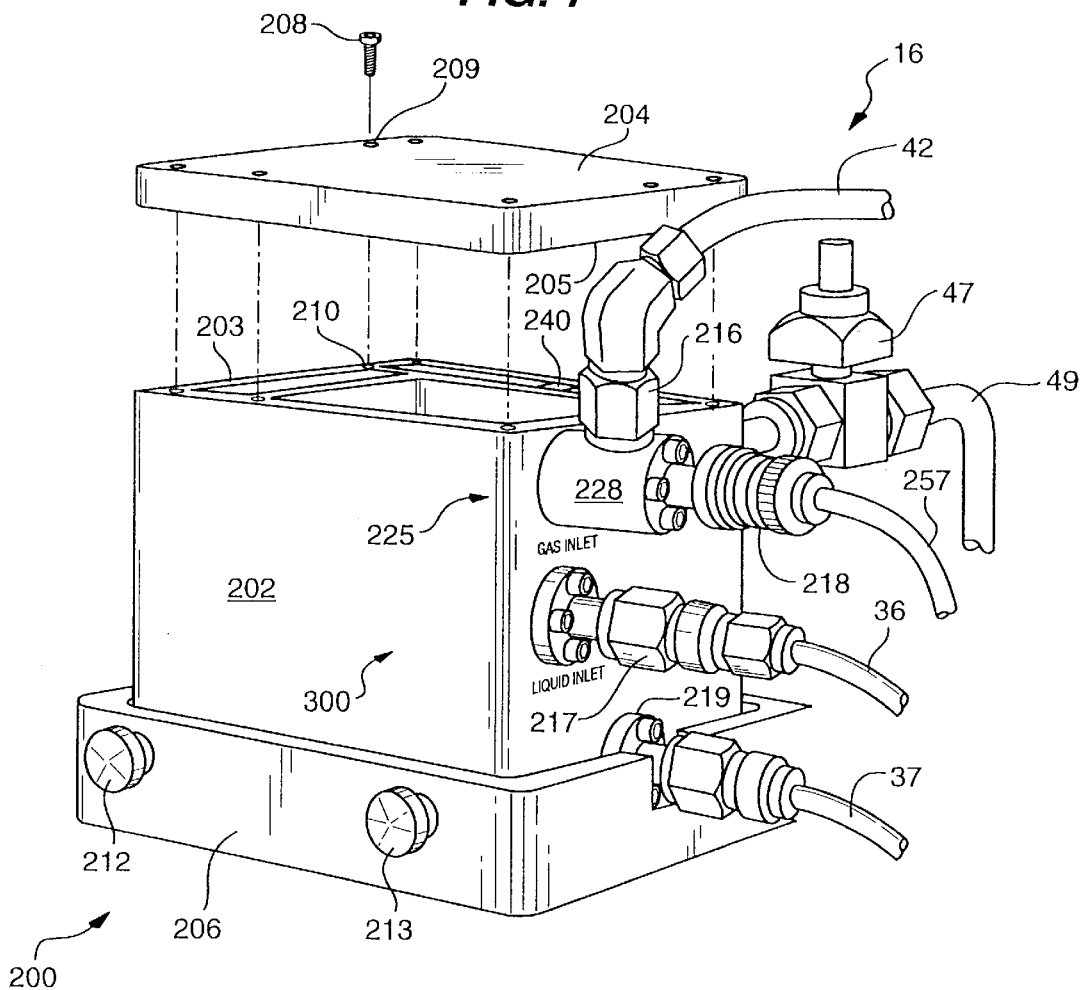
FIG. 7 is a perspective view of the nebulizer and mist refiner according to the invention.

Turning to FIGS. 7–12 the preferred embodiment of the nebulizer/mist refiner portion 16 of the mist generator system 12 is shown. Focusing first on FIG. 7, nebulizer/mist refiner 16 comprises a housing 200 having a body portion 202, a cover portion 204 and a base portion 206. Cover 204 attaches to body portion 202 with bolts 208 which screw through threaded bores 209 in cover and screw into threaded bores 210 in body portion 202. The upper surface 203 of body portion 202 and the undersurface 205 of cover 204 are ground smooth so that they seal tightly when bolts 208 are tightened. Bolts 212 and 213 frictionally engage the lower side of body portion 202 to hold it in place. Base 206 is welded into an equipment rack (not shown). Each of liquid conduits 36 and 37, gas conduit 42, mist conduit 46, and electrical conduits 257 and 357 (FIG. 12) connects to housing body 202 via a sealed connector, such as 216. A corona wire assembly 225 is interposed between gas conduit 42 and nebulizer 300. This will be described in detail in connection with FIGS. 10 and 11. An electrical mist filter system 240 is also indicated in FIG. 7, though this is will be described in detail in connection with FIGS. 8–10, where it is shown in detail.

Figure 10:
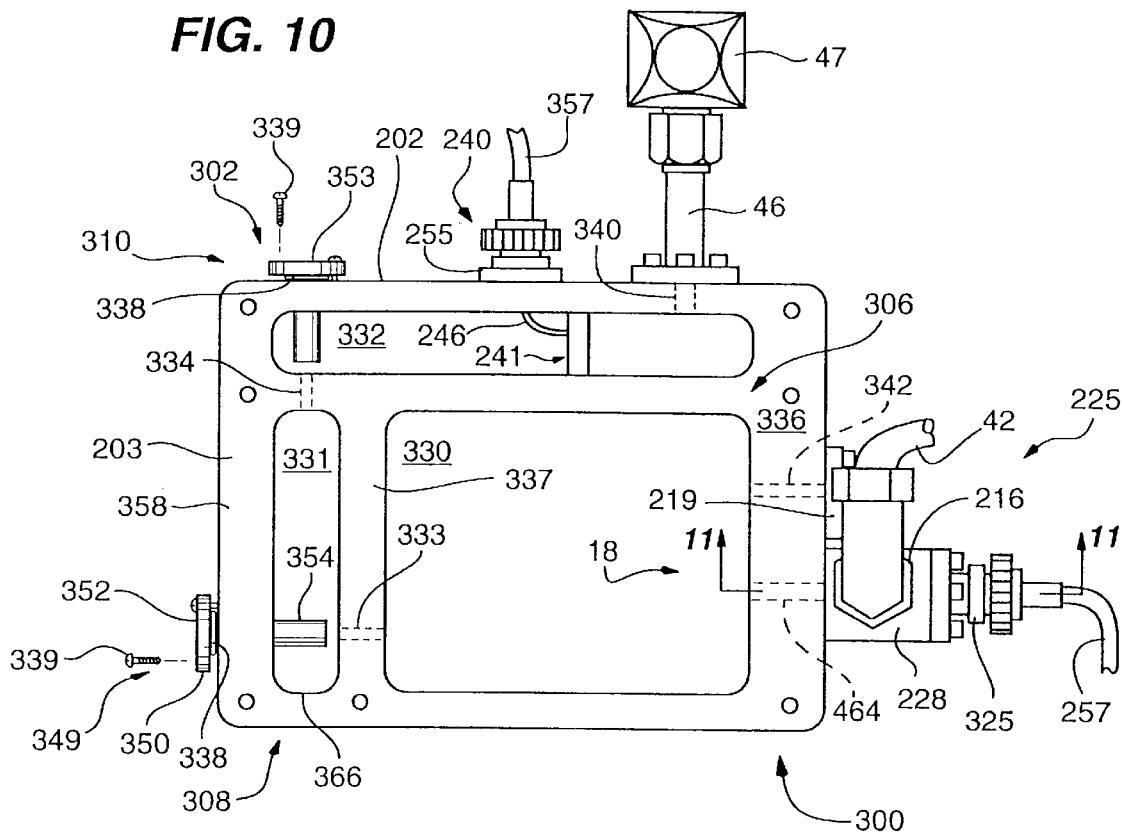
FIG. 10 is a plan view of the nebulizer and mist refiner of FIG. 7, with its cover removed.
Figure 11:
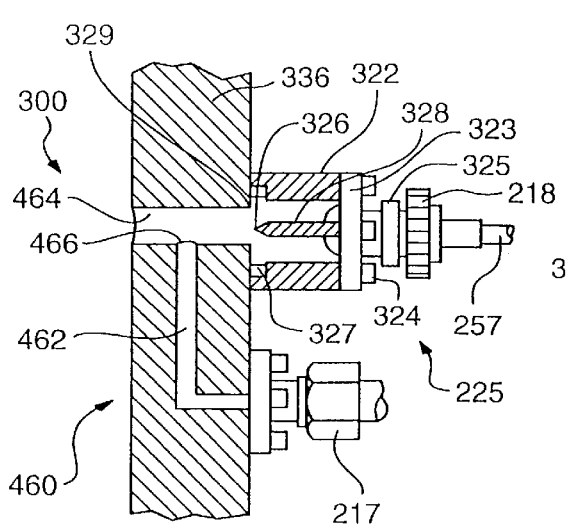
FIG. 11 is a cross-sectional view of the nebulizer through the line 11—11 of FIG. 10.

Turning our focus now to FIG. 10, body 202 comprises a cube approximately five inches on a side and having three hollowed out chambers 330, 331, and 332. First chamber 330 is preferably roughly cubical and about three inches on each side, second chamber 331 is preferably oblong and about three inches long, ¾ inches wide and three inches deep. Third chamber 332 is also preferably oblong and about four inches long, ¾ inches wide and three inches deep. Chamber 330 houses the first stage 306 of mist refiner 302, chamber 331 houses the second stage 308 of mist refiner 302, and chamber 332 houses the third stage 310 of mist refiner 302. Chamber 332 also houses the electrical mist filter 241. Passage 333 connects first chamber 330 with second chamber 331, passage 334 connects second chamber 331 with third chamber 332, and passage 340 connects third chamber 340 with conduit 46. Drain 342 passes through sidewall 336 of housing body 202 and is located at the bottom edge of chamber 330 so that, if this option is used, any liquid collected in chamber 330 drains out of the chamber and back to pressurized reservoir 14 (FIG. 6) via connector 219 and conduit 37. Preferably, this option is not used. Sidewall 336 of housing body 202 is about ½ inches thick and houses the nebulizer 300. FIG. 11 shows a cross-section through sidewall 336 and shows the nebulizer 300 in detail. Nebulizer 300 includes a liquid vessel 462, which is preferably a capillary tube, and a gas passage 464 which meet at throat 466. Preferably, throat 466 is on the underside of gas passage 464, and liquid vessel 462 lies beneath throat 466 so that liquid is pulled into passage 464 by the movement of the gas across throat 466. As indicated above, the gas enters passage 464 via conduit 42 and connector 216, while the liquid enters via conduit 36, valve 220, and connector 217. The ionization required to facilitate the acceleration of the mist by an electric field is provided in part by the venturi nebulizer 300. In the preferred embodiment a corona assembly 225 is used as the primary source of ionization. Corona assembly 225 includes a cylindrical housing 322, an end plate 323 welded to housing 322, an insulating feedthrough 325, a corona wire 328 which is electrically connected to the conductor of cable 257 via electrical connector 218, O-ring 327 and bolts screws 324. The assembly is held to wall 336 by screws 324 and sealed by O-ring 327. Cable 257 is one of two electrical cables comprising power line 57. The tip 326 of corona wire 328 is preferably conical. The distance between the edge 329 of wall 336 and the tip 326 of corona wire 328 is preferably about 1 millimeter (mm). The wall 336 is grounded and the potential difference between the tip 326 and wall 336 creates the corona that produces the ionization.

Each stage of mist refiner comprises an inertial separator, 306, 308, and 310. Passage 464 is offset from the position of passage 333 to prevent streaming of mist particles through chamber 330 directly from passage 464 to passage 333. That is, this arrangement permits the mist to equilibrilize in chamber 330 before passing on to the next stage of particle refining. It also acts as an inertial separator, since large particles will stick to wall 337 and collect in chamber 330. Optionally, if a recirculation system is used, the liquid will drain back into pressurized reservoir 14. It should be understood that whether any given particle will stick to wall 337, piston end 359 or some other part of the mist refiner 302 is statistical in nature. While the statistical probability that a particle will stick to the wall or other portion of refiner 302 increases as the size and mass of the particle increases, it is still a probability. Thus, some particles larger than a given size may make it through the refiner 302 without sticking, while others smaller than the given size may stick. However, overall, when considering a large number of particles with a distribution of sizes, the largest of the particles will tend to be filtered out by the mist refiner 302, and as a result the distribution of particles will shift to a distribution corresponding to a smaller mean particle size.

Figure 12:
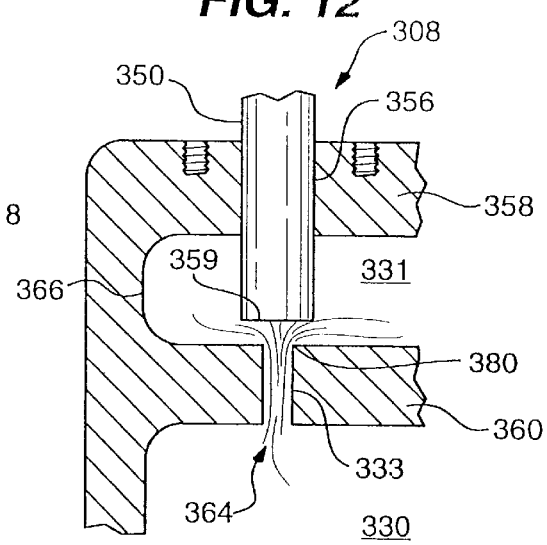
FIG. 12 is a cross-sectional view of the first stage of the mist refiner.

Inertial separator 308 is shown in FIG. 11 and in a cross-sectional detail in FIG. 12. Stage 308 comprises chamber 331, passage 333, and separator piston assembly 349. Separator piston assembly 349 preferably comprises a piston 350, including a head 352 and a stem 354, an O-ring 338 that fits in a groove between head 350 and wall 358, and four screws, such as 339, that pass through bores in head 352 and screw into threaded holes in wall 358. Stem 354 fits snugly in bore 356 (FIG. 12) in wall 358. The end 359 of piston 350 is preferably blunt, and most preferably substantially flat. The nebulizer/refiner system 16 includes several different pistons 350 having different length stems 354. Thus the position of the blunt end 359 from exit 380 of passage 333 can be adjusted by replacing one piston 350 with another piston having a stem 354 of a different length. Passage 333 is preferably a cylindrical bore of about 2 millimeters in diameter and is located in wall 360 directly opposite the end 359 of piston 350. That is, it is centered with respect to bore 356 in wall 358. The difference in pressure between the pressurized gas source 38 and the pressure in deposition chamber 20 causes the mist in chamber 330 to flow through passage 333 into chamber 331. The mist is collimated in passage 333. As indicated by the streamlines 364, the presence of the blunt piston end 359 opposite the passage 333 deflects the flow of mist particles; more technically, it adds a radial vector to the flow of gas and mist particles, i.e. causes the flow to change in direction of the radii of the circle circumscribed by the end 359 of separator piston 349. Again, the larger the particle, the greater its mass and inertia, and the higher probability there is that it will strike and stick to the end 359. The particles that stick to the end 359 will collect and drip off the end into chamber 331. Thus, the distribution of particles is again shifted toward smaller particle size. The closer the piston end 359 is to the exit 380 of passage 333, the more the particles will have to alter their direction, and the greater will be the probability of particles sticking to end 359, and the more particles will stick. In addition, the range of particle sizes that have a probability of sticking that is higher than a given probability will extend into smaller and smaller particle sizes as the end 359 is moved closer to the exit 380 of channel 333. Thus, the distribution of particle sizes, i.e. the mean or average particle size, may be selected by adjusting the position of the end 359 of stem 350. As the end 359 is adjusted closer to pressurized reservoir 333, the distribution of particle sizes in the mist shifts to a smaller particle size and a reduced mean and average particle size. As the end 359 is adjusted away from the exit 380, the distribution of particle sizes in the mist shifts toward a larger particle size. Put another way, if the piston 350 is made longer, the mean and average particle sizes in the mist decrease, and as the piston 350 is made shorter, the mean and average particle sizes in the mist increase. Preferably, exit 380 is located far enough from the end wall 366 of chamber 331 and far enough from the top 203 of body 202 that the end wall 366 and the cover 205 do not significantly interfere with the flow around the end 359. The length of chamber 331 and the placement of the exit passage 334 at the end of chamber 331 located farthest from passage 333, prevents particles from streaming from exit 380 through passage 334 without undergoing many collisions which tend to randomize the particle velocity vectors. The structure and operation of third mist refiner stage 310 is the same as that of second stage 308, except for minor and essentially immaterial differences, such as the slightly different length of chamber 332 and the relative placement of the exit passage 340 with respect to entrance passage 334.

Figure 8:
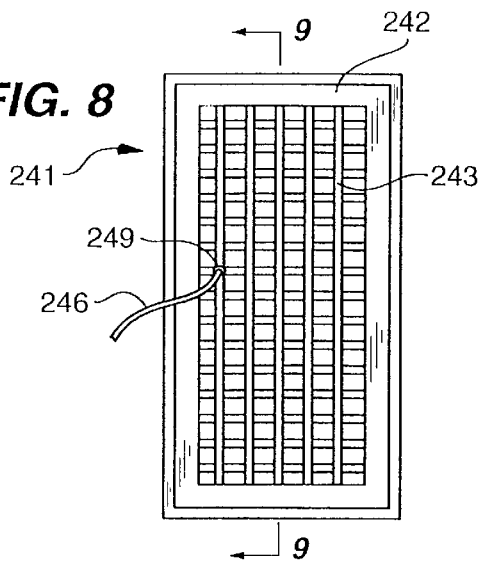
FIG. 8 is a plan view of the electrical mist filter of the nebulizer/refiner of FIG. 7.
Figure 9:
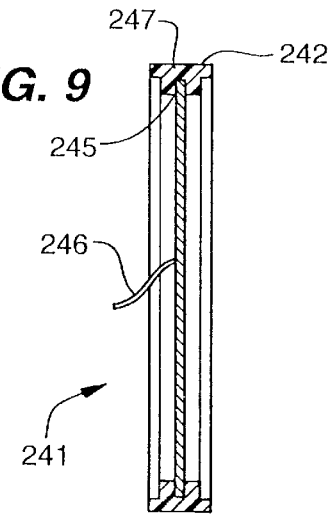
FIG. 9 is a cross-section of the electrical mist filter taken through line 9—9 of FIG. 3.

Mist refiner 302 also includes electrical mist filter system 240, which is optional. Electrical mist filter system 240 includes mist filter 241, conductor 246, electrical feed-through 255, electrical cable 357, as well as cable 66, and power source 64 in FIG. 6. The details or the electrical mist filter 241 are shown in FIGS. 8 and 9. Mist filter 241 includes an insulating frame 242 and a conducting mesh 243. As shown in FIG. 9, the cross-section of frame 242 is T-shaped, with the crossbar of the T having a smooth, flat outer surface 247 shaped to substantially conform with the inside surfaces of chamber 332 as well as the lower surface of cover 204. The stem of the T has bores 245 which receive the ends of mesh 243. Electrical conductor 246 is preferably the center wire of cable 357 and is welded to mesh 243 at 249. Insulating frame 242 is preferably made of Teflon™ or other insulator with some flexibility so that it compresses slightly upon being inserted in chamber 332 and upon fastening of cover 204 and thereby is frictionally held in place in chamber 332. Mesh 243 is preferably made of stainless steel, aluminum, or other electrical conductor that is resistant to the solvents of the precursor. Electrical mist filter is located in chamber 332 in the preferred embodiment, but also may be located in chamber 330, 331, or anywhere else between venturi 460 and substrate 600 along the mist flow path.

Turning now to FIGS. 13–16, the deposition chamber system 20 is shown. The purpose of the deposition chamber 20 is to provide an enclosed and controlled environment to optimize the deposition of the mist onto substrate 600. The substrate is substantially flat and defines a plane parallel to its broad surface, i.e. the horizontal direction in FIG. 15, which preferably also corresponds to a horizontal plane perpendicular to the direction of gravity. Since the substrate sits on the flat ends 678 of substrate holder 616, the flat substrate holder ends 678 also define the same substrate plane. The chamber system 20 includes a deposition chamber housing 605 including a housing base 607 and a housing cover 608. Cover 608 includes a transparent cover plate 610 and a retaining member 612. Chamber system 20 also includes a mist inlet assembly 614 including a combination mist inlet plate/upper electrode assembly 613, a substrate holder 616 generally referred to as a "chuck", a lower electrode plate 618, a conductive cable 620, a substrate drive 622 (FIG. 16), and a neutralizer gas input port 624.

Base 607 comprises a box-shaped member, approximately 24 inches square and about 8 inches high, having a circular central cavity 631, with a circular lip 634 extending into the cavity at a location a few inches below the top surface 635 of the base 607. As will be described below, mist inlet plate/acceleration electrode assembly 613 which is supported by the lip 634, partitions the cavity 631 into a velocity reduction chamber 636 and a deposition chamber 632. A circular groove 637 (FIG. 16) which holds an o-ring 638 (best seen in FIG. 14) is formed in the upper surface of rim 634 to form a seal between housing base 607 and mist inlet assembly 614. A circular pedestal about ½ inch high extends upward in the bottom center of the deposition chamber 632. A circular channel 642 (FIG. 16) extends the chamber 632 outward along its bottom edge. At one side a rectangular passage 630, about 10 inches wide and three inches high connects via an interlock (not shown) to a handler chamber (not shown) that contains a robot arm (not shown) that is used in transferring the wafer into and out of deposition chamber system 20. At the other side, an approximately one inch in diameter outlet passage 644 connects the channel 642 to the exhaust line 26, and an approximately ⅜ inch diameter passage 646 connects the cavity 631 to the mist conduit 49. A mist conduit 647, an approximately inch long tube, extends passage 646 through the wall of mist inlet assembly 614 into velocity reduction chamber 636 to provide a mist inlet port 641. Another passage 648 is of sufficient diameter to pass electrical feed-through 649 connected to cable 66. Four threaded bores, such as 629, and a U-shaped groove 639 are formed in the top 635 of base 607. A temperature conditioning coil 659 lies in groove 639 and is covered with heat conductive grease 689. Substrate drive 622 includes a sealed housing 650 containing a magnetic drive, and a spindle 652 extending from the magnetic drive and passing through a bore 653 in the bottom center of base housing 630 to the substrate holder 616. Drive housing 650 screws into a threaded bore 654 in the bottom of housing 630 so that it forms a single sealed unit with the housing that can be maintained at essentially the same pressure as the deposition chamber 632. The magnetic drive is connected to an uninterruptible power supply (UPS) so that if the conventional power goes out, the substrate does not drop, which could damage it. Neutralizer gas input port includes a tube 656 passing through a bore 657 in the bottom of housing 630 and a connector 658 connecting tube 656 to neutralizer gas conduit 56. The substrate drive 622 is capable of raising and lowering the substrate holder 616 as well as rotating the substrate holder over a wide range of rotational speeds. The drive 622 is also capable of conducting electricity to cable 621 (FIG. 16) in the preferred embodiment, the drive 622 is preferably a drive made by Electromagnetic Design, Eden Prairie, Minnesota, and available from Submicron Systems, Inc., 6620 Grant Way, Allentown, Pa. 18106, which has been modified to be electrically conductive as described below.

Plate 618 comprises a disc 660 made of insulating material. Optionally, it includes a thin conducting layer 662, also, when this option is utilized, is referred to as the "second electrode", formed on its top surface. Plate 618 is preferably spaced from wafer 602 and located on the opposite side of wafer 602 from first plate 682. Insulating disc 660 has six holes formed in it: a central hole 664 is sufficiently wide to permit spindle 652 to turn freely in it; a hole 666 is sufficiently wide to pass neutralizer gas tube 656; the other four holes, such as 668 pass screws, such as 669, which screw into threaded bores, such as 670, to attach lower electrode plate 618 to pedestal 640. Around each of holes 664, 666 and 668 there is a larger hole, such as 672, through the conducting layer 662 so as to provide an insulating gap between the layer 662 and the part that passes through the hole 664, 666, 668. Conducting layer 662 is electrically connected to the feed through 649 and thus the conductor in electrical conduit 66 via cable 620. Substrate holder 616 comprises three arms, such as 674, and a central inverted cup 676 for receiving the end of spindle 652. The end of spindle 652 and the inner surface of cup 676 are shaped so that the inner surface of the cup is close-fitting about the end of the spindle. At the end of each arm 674 is an upright foot, such as 678. Each foot extends about ¼ inch above the arm, and the upper end of each foot is flattened in the horizontal plane; thus the wafer 602 is supported at a minimal three points, yet sits stably on the substrate holder.

In the preferred embodiment, spindle 653, cup 676, and arms 674 are preferably made of a conducting material, such as aluminum, and electrically connect via an internal conductor in drive 650 to cable 621 which in turn connects to power source 64 via multiple wire cable 66 to enable wafer 602 to be grounded and thereby serve as the lower or second electrode. In this embodiment, neutralizer system 21 is not needed, or more appropriately the neutralizer system comprises the wafer 602, the spindle 653, cup, 676, arms 674, cables 621 and 66, and power source 64. Optionally, as discussed above and below, the conducting layer 662 comprises the lower or second electrode.

Preferably the upper electrode 685 is located above the substrate 600 and plate 618 in a substantially vertical direction. Thus, accelerator 18 accelerates the mist particles in a direction substantially perpendicular to the substrate plane. That is, the mist particles follow a substantially vertical path from electrode 685 to substrate 600. This permits gravity to assist in the acceleration of the mist particles.

Figure 13:
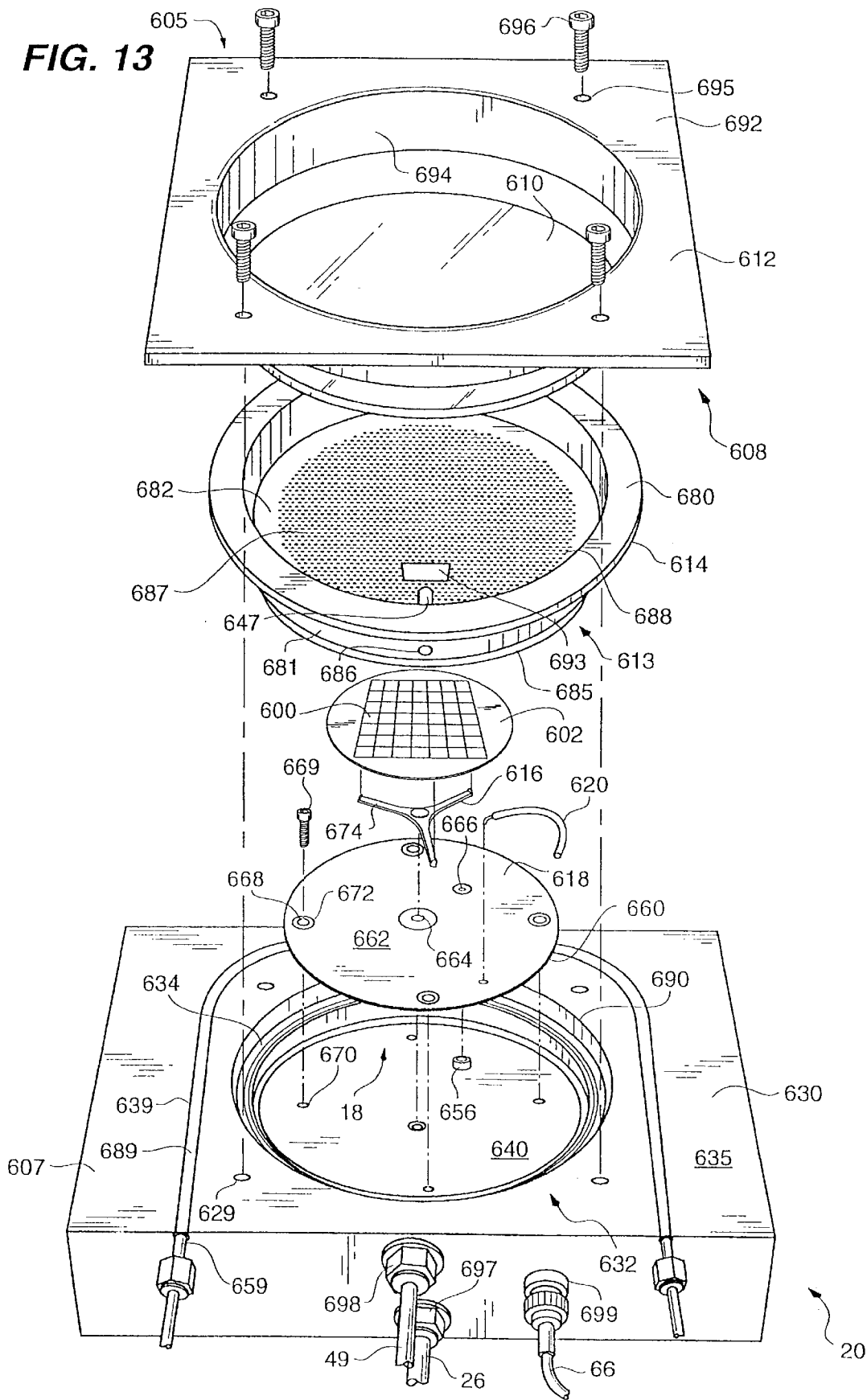
FIG. 13 is an exploded perspective view of the deposition chamber according to the invention.
Figure 14:
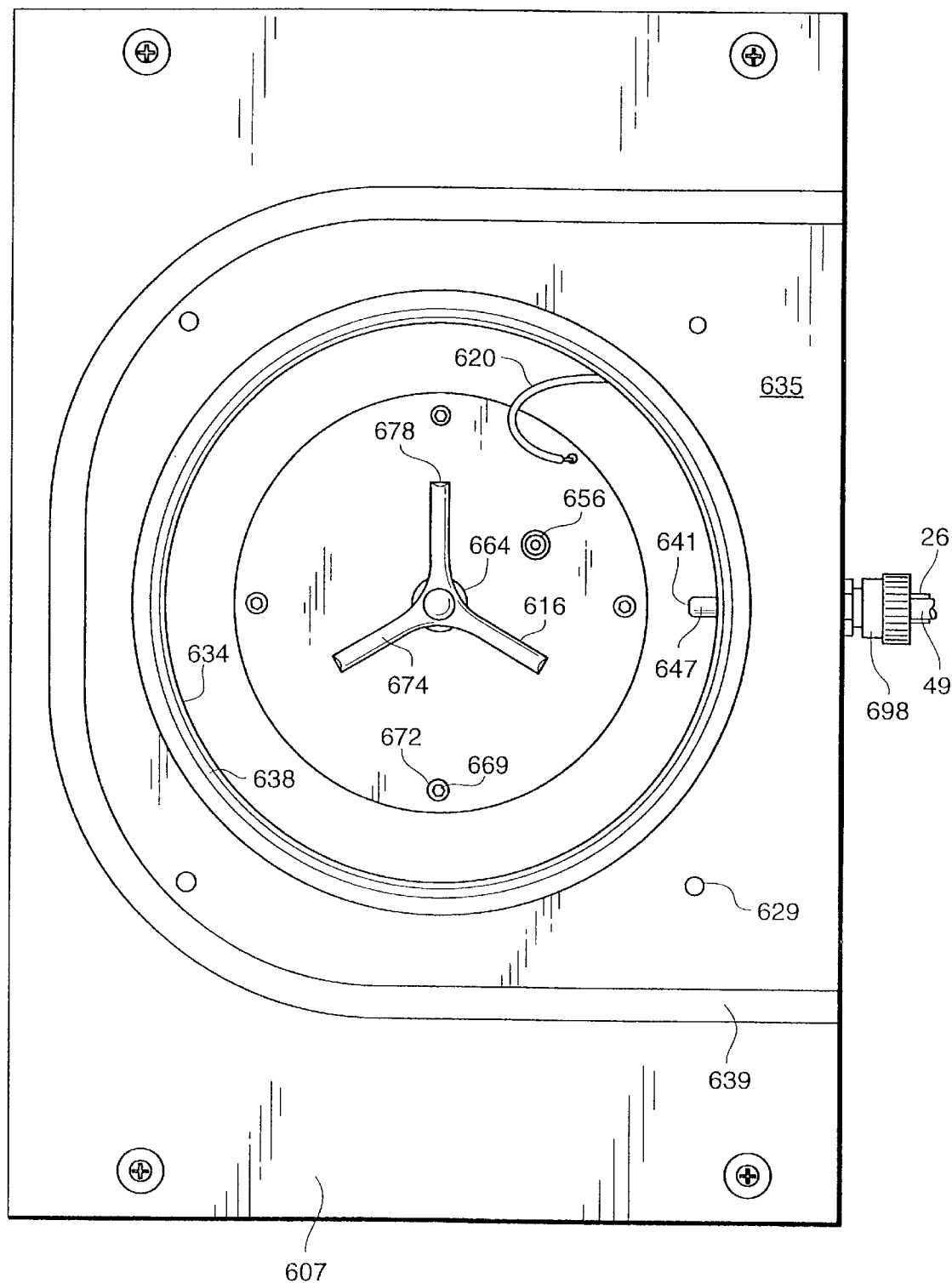
FIG. 14 is a plan view of the base portion of the deposition chamber of FIG. 13.
Figure 15:
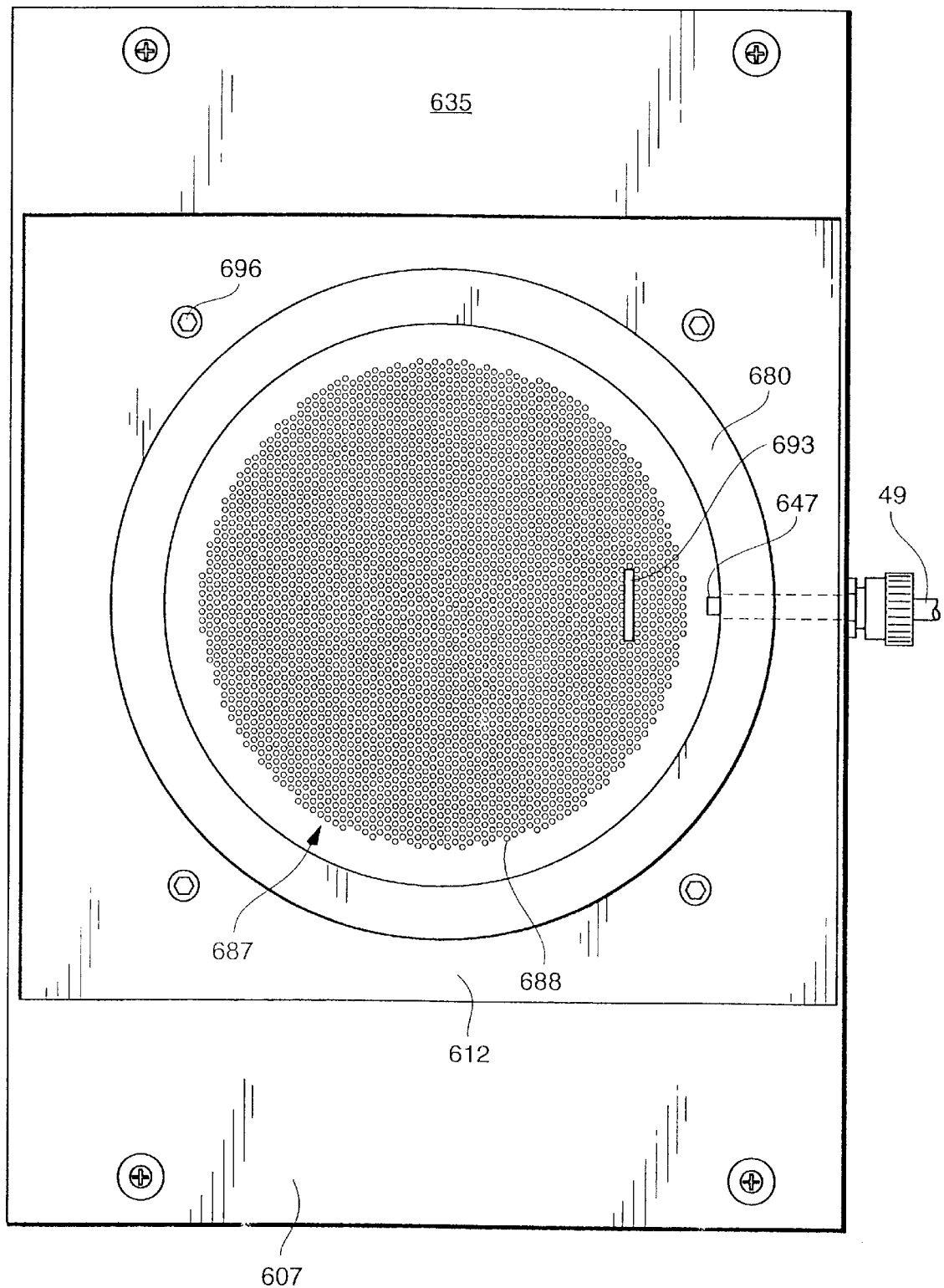
FIG. 15 is a plan view of the deposition chamber with the injection port attached to the base portion of FIG. 14.
Figure 16:
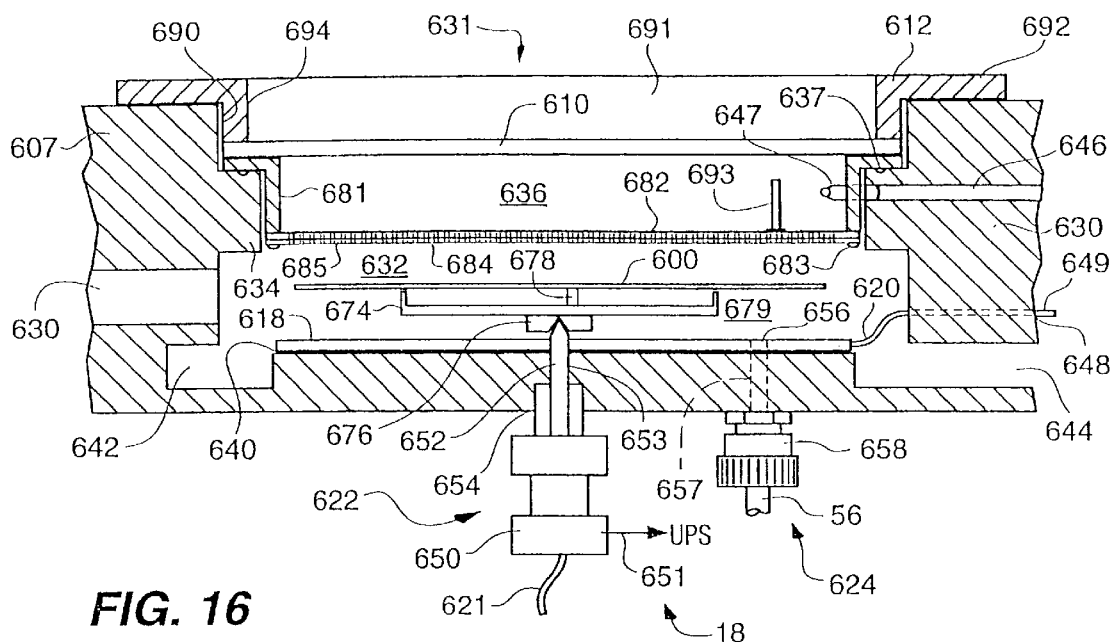
FIG. 16 is a cross-sectional view of the assembled deposition chamber of FIG. 13.

Mist inlet assembly 614 comprises a circular rim 680 of appropriate diameter for fitting within cavity 631 and against lip 634, an inlet plate 682 which has a thin transparent and conductive surface layer 685, also referred to herein as the "first electrode", and a neck 681. Plate 682 is of a diameter to substantially fill the area at the juncture of lip 634 and neck 681. Neck 681 is of an outside diameter to slidably fit within lip 634 without significant play and of sufficient length in the vertical direction so that the lower surface 684 of plate 682 is of a predetermined distance from substrate 600, preferably approximately ½ inch. An oblong hole 686 that is about ⅜ inches wide in the horizontal direction and about ¾ inches long in the vertical direction is formed in neck 681 to receive tube 647. A baffle 693 is welded to the top surface of plate 82 at a location directly opposite and about 2 inches from the exit of tube 647. This baffle intercepts and disperses the steam of mist from tube 647 and prevents streaming of the mist to a particular portion of the inlet plate 682. Mist inlet and upper electrode plate 682 is attached to neck 681 by six screws, such as 683 (FIG. 16). In the preferred embodiment these screws 683 are metal, such as aluminum, and make the electrical connection between electrode 685 and one conductor in cable 66 via housing body base 607. Mist inlet and upper electrode plate 682 including electrode 685 is perforated in area 687 by a pattern of small, preferably circular, holes 688 forming inlet ports 688, which define a mist inlet plane. The holes 688 in FIGS. 13 and 15 are preferably between 0.020 inches and 0.070 inches in diameter and preferably 0.040 inches in diameter. The distance, measured edge-to edge in the plane of the inlet plate, between the inlet ports 688 is preferably between 0.010 and 0.030 inches and preferably as small as possible while still maintaining mechanical stability of the plate 682. Most preferably, the distance, measured edge-to-edge in the plane of the inlet plate 682, between the inlet ports 688 is 0.020 inches or less. There are preferably at least 100 inlet ports per square inch in area 687 of plate 682, and most preferably at least 400 inlet ports per square inch. In the preferred embodiment, there are 440 inlet ports per square inch. The total number of inlet ports in plate 682 is at least 10,000. In the preferred embodiment, there are approximately 17,000 inlet ports, over an area 687 of about 39 square inches. The inlet ports illustrated in the drawing are larger than the actual inlet ports, and the distance between them is larger than the actual distance, since the actual size is too small to visibly distinguish in a drawing. The small size, large number, and close spacing of the inlet ports is very important, otherwise, the deposition of the mist on the substrate will be uneven, and can even form visible deposition rings on the substrate 600. It is particularly important that the inlet ports 688 are no more than 0.020 inches apart, edge-to-edge in the plane of the inlet plate 682. The large number and close spacing of the ports is also important because it makes the inlet plate mostly open space, which allows radiation, from infrared to ultraviolet, to pass through it relatively freely. As discussed below, this permits in situ drying and annealing of the deposited mist. The inlet ports are drilled in the plate 682 by a laser drill controlled by a computer. The inlet ports are substantially uniformly distributed on the plate; alternatively, they are distributed in a uniform randomized manner. The uniform and randomized distribution leads to uniform deposition, but is not as important as the distance between the ports in producing a uniform distribution. Thus, in case of conflicts between randomizing the port position and closeness of the ports to one another, as for example due to physical constraints relating to mechanical stability of the plate, closeness should be chosen. Random hole locations can be determined in the following manner. The computer locates a hole in the plate by first defining an array of points that correspond to the points of intersection of perpendicular lines representing rows and columns. This essentially uniform distribution of points is then randomized within a predefined range. That is, for each point, a random location over a range centered at the point is determined. The hole is then drilled at this randomized location. Since each location is randomized, the net result is a random distribution of inlet ports. This process is repeated for each point in the array. Preferably, the distance between the row lines and column lines is between 0.040 inches and 0.20 mm, and preferably about 0.60 inches, and the range over which each point is randomized is from 0.01 inches to 0.20 inches, and preferably 0.04 inches. Since each point is randomized, points will not be placed at correlated locations. This prevents a correlated deposition pattern that could lead to non-uniformities in the deposition. For example, if a regular pattern at the intersection of lines in the array was selected, two or more points would be located at the same radius from the center of the plate, and as the plate rotated, deposition rings would be created. The inlet plate 682 defines an inlet plane substantially parallel to the substrate plane, and its area, in the inlet plane parallel to the substrate plane is as large as or larger than the area of substrate 600. The inlet ports 688 cover an area 687 of inlet plate 682 that is no smaller than 75% of the area of the substrate 600 on which the mist is to be deposited, and preferably equal to or greater than the area of the the substrate 600. In the most preferred embodiment, the area 687 that the inlet ports 688 cover is a circle of a diameter about 10% larger than the area of substrate 600 so that it overlaps the outer edge of substrate by a small amount. Thus, if the substrate is slightly misaligned, its entire surface will be uniformly covered. The area 687 that ports 688 cover is preferably not significantly larger than the area of substrate 600, so that precursor is not wasted.

Cover plate 610 comprises a circular disk about ¼ inch in thickness and of sufficient diameter to fit loosely within the diameter of the upper portion of 690 of cavity 631 without significant play. Preferably it is transparent to ultraviolet and infrared radiation, and preferably it is made of quartz. The lower surface of cover plate 610 and the upper surface of rim 680 of mist inlet assembly 614 are ground flat so that when pressed together they form an airtight seal. Retaining member 612 comprises a plate 692 having an outside dimension in the horizontal direction that is larger than the diameter of the upper portion 690 of cavity 631 and a circular opening 691 that is of a diameter smaller than the diameter of the upper portion of cavity 631. A circular flange 694 extends downward from plate 692 and is of an outside diameter that fits loosely but without significant play within the upper portion 690 of cavity 631. Four bores, such as 695, are formed in plate 692, one approximately in each corner. Bores 629 in base 607 align with bores 695 in plate 692 so that plate 692 can be firmly secured to base 607 by four bolts, such as 696. Deposition chamber system 20 is assembled by first connecting it to the interlock (not shown) that connects to the passage 630 and then screwing substrate holder driver housing 650 and connectors 658, 697, 698, and 699 into corresponding threaded bores in base 607, inserting temperature conditioning coil 659 and grease 689 in U-shaped groove 639, attaching lower electrode plate 618 to pedestal 640 with screws 669, soldering cable 620 to feed-through 649 and conducting layer 662, placing substrate holder 616 on the end of spindle 652, and inserting o-ring 638 in groove 637. Then mist inlet assembly 614 is aligned over cavity 631 so that hole 686 is above tube 647, and inserted into cavity 631, preferably by dropping the end with hole 686 downward first so hole 686 can be passed around tube 647, then dropping the other side in so that the underside of rim 680 presses against o-ring 638. Cover plate 610 is then dropped into cavity 631 so that it rests on the top surface of rim 680, then retaining member 612 is inserted into cavity 631 so that the bottom end of flange 694 rests on the top surface of cover plate 610. Bolts 696 are then inserted through bores 695 and screwed into bores 629 causing retaining member 612 to compress plate 610 against mist inlet assembly 614 and thus causing mist inlet assembly 614 to compress o-ring 638 to provide an airtight seal of the deposition chamber system 20.

A schematic diagram of ionized particle source 69 is shown in FIG. 17. Ionized particle source 69 comprises a radioactive element 1000 contained in an enclosure 1002. A gas inlet conduit 1004 connects enclosure 1002 to a source 55 (FIG. 6) of a carrier gas. A gas outlet conduit 56 connects enclosure 1002 to the deposition chamber system 20. Preferably the radioactive element 1002 produces positive and negative ions 1010. The carrier gas, which is preferably dry nitrogen, argon, or other essentially inert gas, picks up the ions 1010 as gas passes through enclosure 1002 and takes them into the deposition chamber 632 where those of opposite charge to the wafer impinge on the wafer 602, to both neutralize the wafer and the particle, and escape from the chamber 632 via exhaust conduit 26.

The computer (not shown) and display 80 used in the deposition system according to the invention may be any state-of-the-art work station, PC or other similar computer, for example, a Hewlett-Packard™, DEC™, SUN™. In FIG. 6, the display is shown somewhat more oblong in the horizontal direction than in actual practice, because of the constraints required for patent drawings. The nebulizer/mist refiner housing 200, piston 350, screws 339, bolts 212, 213, and 228, and deposition chamber base 607 are preferably made of aluminum, though other metals or suitable materials may be used. Corona housing 328 is preferably made of stainless steel. Insulating feed through 325 is preferably made of ceramic, such as alumina. Corona wire 328 is preferably made of tungsten. Conduits 26, 36, 37 46, 49, and 56 are preferably made of Teflon™, but other materials such as stainless steel, aluminum, or other suitable material may be used. Temperature conditioning coil 659 is preferably made of copper, but aluminum or other material that conducts heat well may be used. Substrate holder 616 is preferably made of ceramic, such as alumina, but other non-conductive materials may also be used. Disk 660 is preferably made of a ceramic, such as alumina, while conductive layer 662 is preferably copper, though other suitable materials may be used; for example, a disk 660 made of a circuit board material, such as woven glass, and covered with layer 662 a conventional conductive trace material, such as a copper-gold alloy, has also been successful for lower electrode plate 618. Rim 680 and neck 681 of mist inlet assembly 614 are preferably made of aluminum, though other suitable conductive material may be used. In one embodiment, mist inlet and upper electrode plate 682 is preferably made of quartz with a thin conductive coating 685 that is transparent to UV and infrared radiation, such as indium tin oxide. Preferably conductive coating 685 is about 500 angstroms thick and is formed by sputtering, though it may be formed by other suitable deposition methods. This permits it to pass infrared (IR) and ultraviolet (UV) and at the same time be conductive. In the preferred embodiment, it is made of aluminum or other suitable metal and, as discussed above, the area 687 of the plate directly above the substrate 600 has so many inlet ports 688 that it is essentially an open space through which radiation, including infrared and ultraviolet radiation, can freely pass. Retaining member 612 is preferably made of aluminum with a thin gold coating, though other suitable material may be used. The gold coating reflects infrared much better than the aluminum, thus helps focus the IR radiation into the area of deposition chamber 632. Ionized particle source 69 is preferably a Nucecell™ static eliminator Model P-2031, made by Amstat Industries of Glen View, Ill. The materials of which the other portions of the system 10 according to the invention are made have been discussed elsewhere herein or are conventional.

The misted deposition system 10 according to the invention operates to reduce the average and median size of particles in the mist as follows. A liquid precursor solution is forced into liquid vessel 462 by the action of pressurized reservoir 14 under the control of mass flow controller 220, while gas is forced through passage 464 by means of compressed dry nitrogen and oxygen gas source 38 under the control of valve 40. The flow of gas across the throat 466 causes it to nebulize into a mist under the venturi principal. In one embodiment of the invention, the flow of gas is also sufficient to provide enough energy to ionize the mist by means of frictional forces. In the preferred embodiment, a negative voltage of between 5000 volts and 10,000 volts, and preferably about 7000 volts is applied to corona wire 328 via DC voltage source 64 and electrical cable 57. This charge is transferred the gas and mist particles and causes the mist to acquire a negative charge. (However, see discussion below on negative and positive charged mist particles being present in the deposition chamber 20). As indicated above, the wall 337 in combination with offset of inlet 464 from outlet 333 separates large particles from the mist, as the larger particles with more inertia have a higher probability of making it to wall 337 without being deflected away by collisions with other particles, and have a higher probability of sticking to wall 337 if they hit it. The large size of chamber 330 as well as the fact that the exit 380 of passage 333 is offset from the passage 464 permits the mist particle velocity to randomize in the chamber. The lower pressure in chamber 331 then causes the particles to flow through passage 333. As the mist exits passage 333, separator piston 349 forces the flow to the side, separating more massive particles, which have higher probability of hitting the end 359 of piston 349 and sticking to the end, from the mist. Again, the length of chamber 331 and the location of passage 334 away from passage 333 allows the mist particle velocity to randomize in the chamber. The same process repeats again in chamber 332. The size of the mist particles is regulated by the position of pistons 352 and 353. A negative voltage of between 200 volts and 1500 volts, and preferably 500 volts, is applied to mesh 243. This negative voltage attracts the positively charged mist ions and causes a large portion of them to precipitate out, leaving primarily negative ions in the mist. The mist passes out of nebulizer/mist refiner 16 via passage 340 and enters deposition system 20 via tube 647.

The mist particles exiting nebulizer/mist refiner 16 preferably have a Gaussian distribution of particle sizes, with a mean particle size of between 0.1 and 1 micron, preferably less than a micron, and most preferably 0.5 microns or less.

Figure 19:
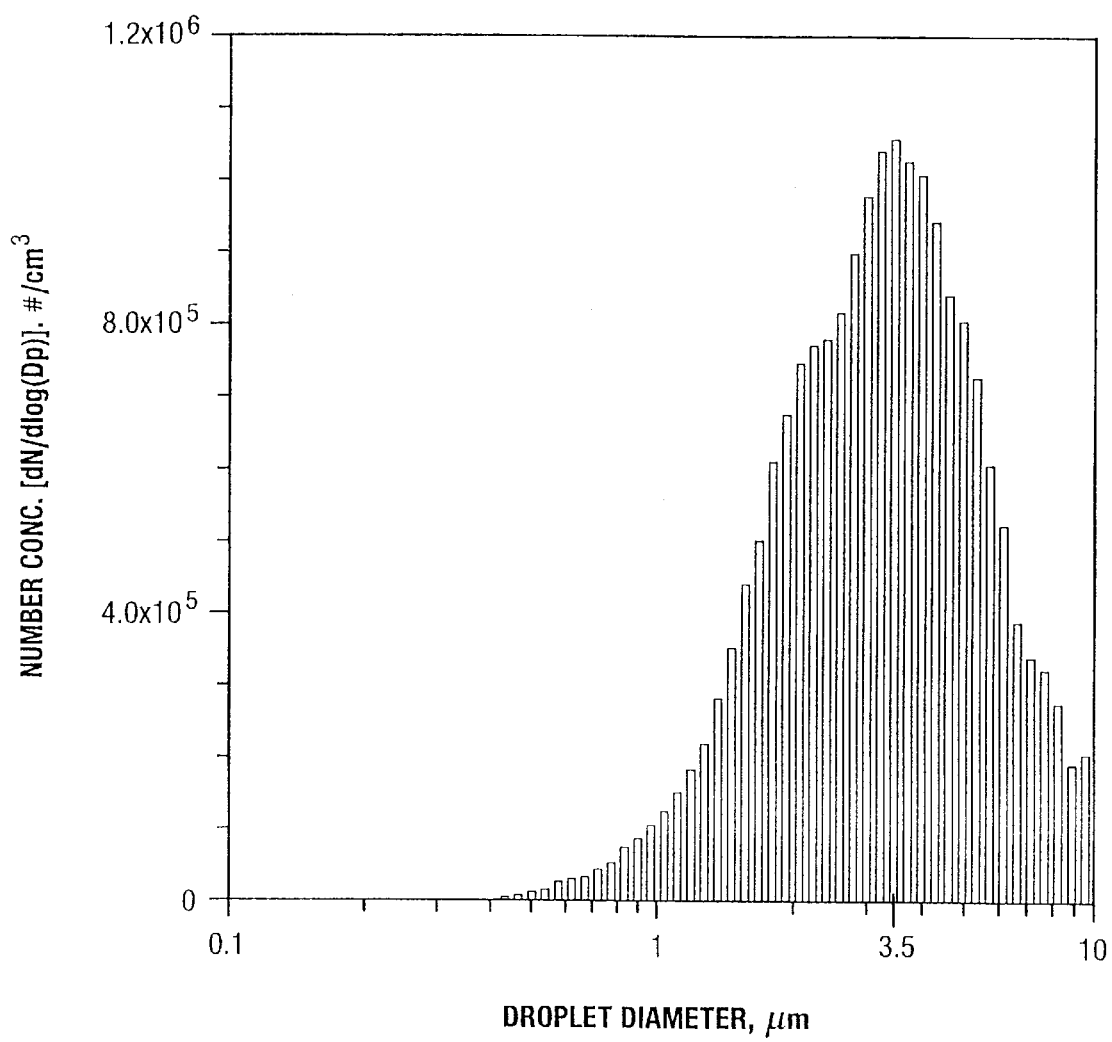
FIG. 19 is a graph of number concentration versus droplet diameter for the prior art misted deposition system.
Figure 20:
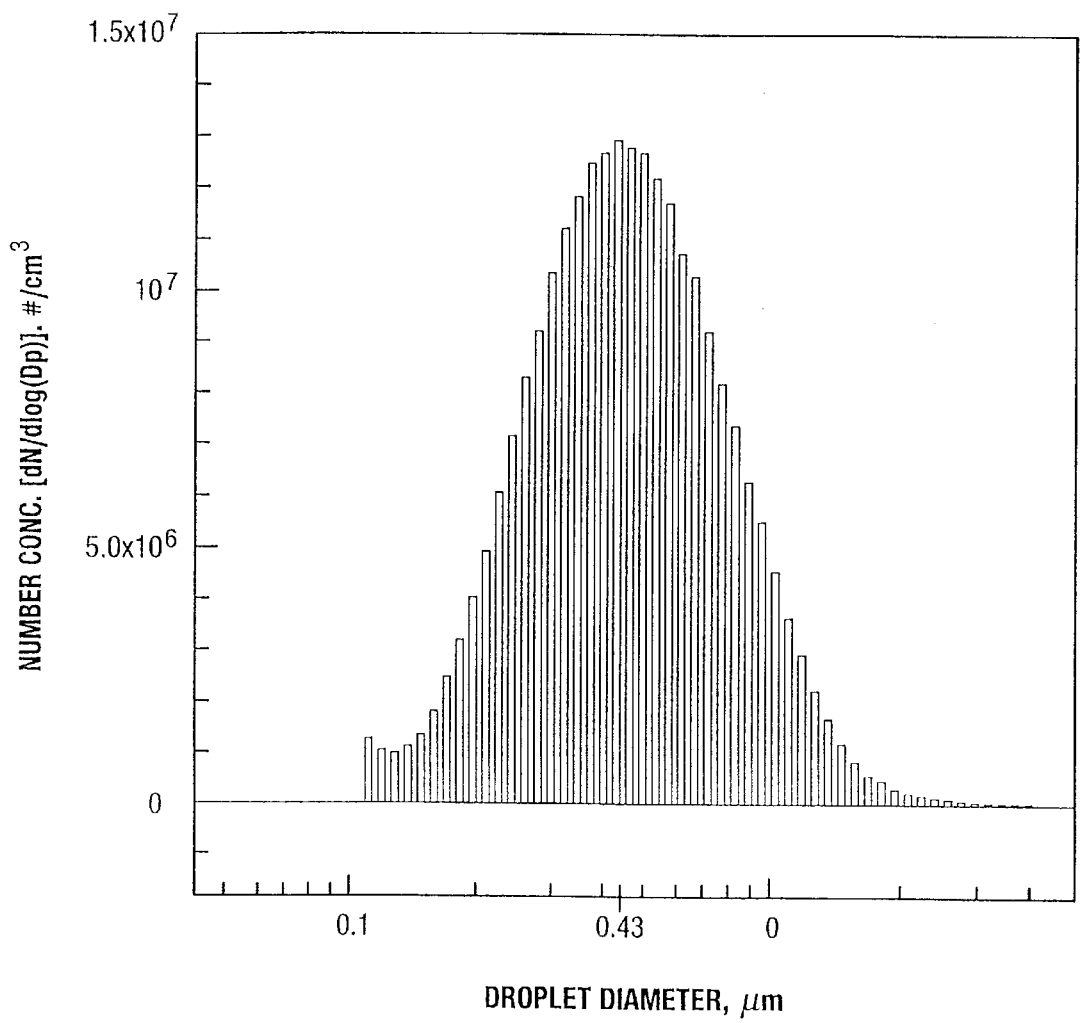
FIG. 20 is a graph of number concentration versus droplet diameter for an embodiment of the present invention.

This is smaller than the particle size in the prior art by more than a factor of 3. FIG. 19 shows a typical particle size distribution obtained in the prior art, graphed as the droplet diameter in microns along the abscissa versus the number concentration of particles in number per cubic centimeter (logarithimatically scaled). The approximately Gaussian function peaks at about 3.5 microns. A particle size distribution measured with the nebulizer/refiner 16 of the present invention is shown in FIG. 20. Here, the curve peaks at about 0.43 microns. That is, the mean particle diameter is about 0.43 microns. This was the distribution obtained using a mist conduit 42 of ¼ inch diameter and a gas passage 464 and capillary diameter of about a millimeter, and was the distribution used In the example below. A recent measurement made using ⅜ inch diameter mist conduit 42 and a smaller, about ½ millimeter, gas passage 464 and capillary 462 showed a peak at about 0.2 microns. The mist first enters velocity reduction chamber 636, where the size of the chamber and the location of the exit holes 688 in a direction perpendicular to the direction of entry tube 647 allow the particle velocity to randomize in the chamber. Importantly, since the total area of the holes in inlet plate 682 is about ten times the inside diameter of tube 49, the velocity of the mist through the holes 688 in inlet plate 682 will be substantially less than the velocity of the mist through mist conduits 49 and 647. The lower pressure in deposition chamber 632 as compared to velocity reduction chamber 636, caused by the pumps in the exhaust system 24 as well as the pressurized source 38, causes the mist to pass through holes 688 into deposition chamber 632. It should be noted that the mist exits velocity reduction chamber 636 in a direction substantially perpendicular to the direction it entered the velocity reduction chamber through port 641. This again permits the mist particle velocity to randomize before it exits the velocity reduction chamber, and prevents streaming from the port 641 directly into the deposition chamber 632.

The probability of a particle sticking to a surface is at a minimum near 0.5 microns. Thus, the mist as described above will have a low probability of sticking to substrate 600 as it passes through the deposition chamber 632. However, the deposition chamber housing 605, including base 607 and electrode 685 is grounded, while a positive voltage of between 3000 volts and 7000 volts, and preferably 5000 volts is applied to wafer 602, or lower electrode plate 618 in the alternative embodiment. In the latter case, since wafer 602 is not a good conductor, and is quite thin, the field lines caused by the difference in voltage between upper electrode 685 and lower electrode plate 618 pass through it with little deflection. Thus, the combination of the grounded chamber housing and the positively charged lower electrode plate 618 just beneath the substrate tends to focus the negatively charged particles to move toward the substrate. In the preferred embodiment, the charge on the substrate itself causes the negatively charged particles to move toward the substrate. The charged mist particles follow the field lines, accelerate as they pass from electrode 685 to substrate 600, and have a significantly increased velocity, and thus a significantly increased probability of sticking to substrate 600 when they strike the substrate. Since the inlet plate 682 is located substantially directly above the substrate 600, gravity assists the deposition of the mist on the substrate, though this contribution is very small. More importantly, in this orientation, any effect of gravity does not cause even small perturbations in uniformity of the deposition. At the same time, in the preferred embodiment, dry nitrogen is discharged by conduit 656 to purge the area under the substrate 602 to inhibit mist particles in sticking to the underside of the substrate. In the alternative embodiment, ionized particles are discharged by conduit 656 in a substantially upward direction into the space 679 between the plate 618 and the substrate 600. Thus, although the negatively charged mist particles cause the substrate to acquire a negative charge, this negative charge of the substrate is continuously neutralized by the positively charged ions striking it. Wafer 602 has sufficient conductivity and is quite thin which allows the charges from the mist particles to pass through it and be neutralized. Neutralization can also occur by the charged ions flowing around the wafer 602 to the substrate side, where they are attracted to the negatively charged substrate 600. They also may neutralize mist particles just above the substrate surface. Since the mist particles have much greater mass than the charged ions, and the mist particles have accelerated greatly under the influence of the electric field, the presence of the charged ions on the substrate side of the wafer will have little affect on the deposition, except to neutralize either the mist particles just above the substrate or on the substrate.

An exhaust comprising the mist that does not deposit, and the neutralized ions in the alternative embodiment, exits from the deposition chamber via a circular channel forming an exhaust port 642 and thence to exhaust outlet passage 644. Exhaust port 642 substantially defines a ring about the periphery of an exhaust plane parallel to the substrate plane.

EXAMPLE 1

As an example of the use of the apparatus according to the invention and the process of the invention an integrated circuit capacitor was made. In this discussion we shall refer to the capacitor 1106 in FIG. 18 to illustrate the device, though it should be understood that only the capacitor 1106 was made in the example, and not the full memory cell 1102. In this example, the layer 1122 between the electrodes of a capacitor 1106 was fabricated using the apparatus and process of the invention. The system used in this example utilized the smaller ¼ inch gas and mist lines 42 and 47, a capillary 462 of about 1 millimeter in diameter, and did not use an electrical mist filter system 240. The material 1122 was strontium bismuth tantalate. The compounds shown in Table A were measured. In Table A "FW" indicates formula weight, "g" indicates grams, "mmoles" indicates millimoles, and "Equiv." indicates the

TABLE C

| Compound | FW | g | mmole | Equiv. |
| --- | --- | --- | --- | --- |
| Tantalum butoxide | 546.52 | 52.477 | 96.020 | 2.0000 |
| 2-ethylhexanoic acid | 144.21 | 87.226 | 604.85 | 12.598 |
| Strontium | 87.63 | 4.2108 | 48.052 | 1.0009 |
| Bismuth 2-ethylhexanoate | 790.10 | 82.702 | 104.67 | 2.1802 | equivalent number of moles in solution. The tantalum butoxide and 2-ethylhexanoic acid were placed in a flask and about 50 milliliters (ml) of xylenes was added. The mixture was stirred on low heat of between about 70° C. and 90° C. for 48 hours. The strontium was added and the solution was again stirred on low heat until completely reacted. The temperature was then raised to a maximum of 120° C. while stirring to distill out the butanol, until there remained about 40 ml of distillate. Then the bismuth 2-ethylhexanoate was added and diluted to 240 ml with xylenes. The concentration was 0.200 moles of $SrBi_2Ta_2O_9$ per liter. This precursor was stored until ready for use.

Just prior to deposition, 20 ml of a strontium bismuth tantalate precursor as described above was placed in reservoir 14 and the reservoir was sealed and connected to the nebulizer 16. The gas pressure in nebulizer 16 was set at 80 pounds per square inch (psi) via valve 40. A substrate 600 comprising a silicon wafer 602 with layers of silicon dioxide and platinum deposited on it was placed in the deposition chamber 632 on the substrate holder 616. A voltage of a negative 7000 volts was placed on corona wire 328 and a voltage of a positive 5000 volts was placed on lower electrode plate 618. The deposition chamber 632 was pumped down to 595 Torr. The gas flow through neutralizer 69 was set at 50 standard cubic centimeters per minute (sccm). Substrate drive 622 was turned on to rotate substrate holder 616 at 15 cycles a minute. The mist valve 47 was opened and the mist was deposited for 10 minutes. The wafer 602 was removed from the deposition chamber 632 and placed on a hot plate where it was dried at a temperature of 15° C. for 1 minute, then baked at a temperature of 260° C. for 4 minutes. The wafer 602 was then transferred to a rapid thermal processing oven where rapid thermal processing (RTP) was performed at 725° C. for 30 seconds in oxygen. Then the wafer 602 was returned to the deposition chamber 632, the mist was formed again and the deposition step followed by removal from the deposition chamber, drying, baking and RTP was repeated. The wafer 602 was then annealed in oxygen for one hour. The resulting layer 1122 was approximately 1800 Angstroms (Å) thick and the thickness uniformity was approximately within 12%.

After the anneal step, an integrated circuit capacitor was completed, i.e. a second platinum electrode 1124 was sputtered on and the wafer was then etched using well-known photo-resist techniques to produce a plurality of capacitors electrically connected via bottom electrode 1120.

Hysteresis measurements were made on the strontium bismuth tantalate capacitor fabricated by the above process using an uncompensated Sawyer-Tower circuit at 10,000 Hertz and at a voltage of 5 volts. The hysteresis curves were tall and boxy, indicating the capacitors would perform well in a memory. The polarizability, 2Pr, was 17.5 microcoulombs/cm$^2$. The coercive voltage, 2Ec, was 83.71 kilovolts/centimeter and the measured leakage current was about 4×10$^{-8}$ amps per square centimeter, which are again excellent results showing the material would perform excellently in a memory. Fatigue was measured by the decrease in 2Pr as a function of frequency, and was found to be 1.7% at 5×10$^{10}$ cycles.

In the above example and other runs of the system 10, some mist accumulated on the bottom surface 684 of upper electrode and mist inlet plate 682 as well as on the substrate 600 and the lower electrode 618. This indicated that at least some of the particles in the deposition chamber 632 were positively charged. This suggested that there was some other source of ions than the corona wire 328. This ionization was traced to the venturi 460. Modifications of the system were then made to intentionally use the venturi to ionize mist particles into both negatively and positively charged ions, and to separate out the positively charged ions in the nebulizer/refiner. At the same time, improvements were made to decrease the size of the particles and to decrease the amount of precursor fluid that recirculated to the reservoir 14. The preferred embodiment described above includes these modifications. Examples run on the modified and preferred system show better uniformity, better step coverage at the same deposition rates, and about three times the deposition rate for the same uniformity and step coverage. In addition, the system utilizes less precursor liquid since the mist particles are smaller and less precursor is removed in the refining process.

The electrical charges indicated above may be reversed; that is, the electrical filter is given a positive charge and filters out the negative mist particles. The upper electrode 685 is given a positive charge, and the substrate is grounded.

A feature of the invention is that the substrate is oppositely charged to the mist particles. It has been found that the opposite charge of the substrate to the mist is more critical than simply giving the particles a high velocity towards the substrate. This is because, no matter how fast the particles are moving, a laminar flow is set up over the substrate by the flow of the carrier gas. If the substrate is not charged, a mist particle coming in toward the substrate will follow the laminar flow path, and never touch the substrate. At higher velocities, the laminar planes become more compact and are very close to the substrate, but still the particles do not touch the substrate. Put another way, the particles are of such small size, that the do not have enough inertia to break out of the laminar flow. There is an essentially immobile boundary layer of particles and gas next to the substrate, and the mist particles in the laminar flow layers do not touch the substrate. However, if a the substrate is strongly and oppositely charged to the particles, as the particles flow past the substrate in their laminar planes, they are constantly and strongly attracted toward the substrate, break through the boundary layer and strike the substrate, and stick due to the strong attractive force.

An important feature of the invention is a mist generation system 12 that includes the combination of a mass flow controller 15 with a venturi nebulizer 300. This combination provides excellent control of the misting process. This combination is critical to producing integrated circuit thin films with good step coverage, excellent electrical properties, in a repeatable manner that can be utilized in a commercial manufacturing process.

Although there has been described what is at present considered to be the preferred embodiments of the invention, it will be understood that the invention can be embodied in other specific forms without departing from its spirit and essential characteristics. Now that the advantages of using a mist inlet assembly according to the invention, the mist accelerator according to the invention, a combination mist inlet plate and electrode, and the many other features of the invention are known, additional embodiments may be devised by those skilled in the art. Moreover, the specific shapes, dimensions, and other parameters of the system may be varied without departing from the teachings of the invention. The present embodiments are, therefore, to be considered as illustrative and not restrictive. The scope of the invention is indicated by the appended claims.

We claim:

1. Apparatus for fabricating an integrated circuit comprising:

(a) a mist generator for forming a mist of a liquid precursor;

(b) a velocity reduction chamber in fluidic communication with said mist generator;

(c) a deposition chamber;

(d) a substrate holder for supporting a substrate within said deposition chamber, said substrate holder defining a substrate plane and a substrate deposition area in said substrate plane;

(e) a mist inlet plate between said velocity reduction chamber and said deposition chamber, said mist inlet plate having a plurality of inlet ports defining an inlet plane substantially parallel to said substrate plane, said inlet ports distributed over an inlet port area of said inlet plate that is at least 75% of said substrate deposition area to provide a substantially uniform deposition of said mist on said substrate deposition area; and (f) an exhaust port for withdrawing exhaust from said deposition chamber.

2. Apparatus as in claim 1 wherein said inlet port area is equal to or greater than the area of said substrate.

3. Apparatus as in claim 1 wherein the distance between said inlet ports is 0.020 inches or less measured edge-to-edge in said mist inlet plane.

4. Apparatus as in claim 1 wherein there are 5000 or more of said inlet ports distributed over said inlet port area.

5. Apparatus as in claim 1 wherein said inlet ports are holes that are between 0.02 and 0.060 inches in diameter.

6. Apparatus as in claim 5 wherein said inlet ports are holes in said inlet plate that are substantially 0.040 inches in diameter.

7. Apparatus as in claim 1 wherein said substrate plane is located between said mist inlet plate and said exhaust port.

8. Apparatus as in claim 1 wherein said velocity reduction chamber further comprises a velocity reduction chamber inlet port located so that mist enters said velocity reduction chamber in a direction substantially perpendicular to the direction said mist exits said velocity reduction chamber.

9. Apparatus as in claim 1 wherein said inlet plate is located substantially directly above said substrate whereby gravity assists said deposition of said mist on said substrate.

10. Apparatus as in claim 1 wherein said exhaust port substantially defines a channel about the periphery of an exhaust plane parallel to said substrate plane.

11. Apparatus as in claim 1 wherein said deposition chamber further includes a mist particle electrical accelerator for electrically accelerating mist particles in a direction substantially perpendicular to said substrate plane, and said inlet plate comprises an electrode of said electrical accelerator.

12. Apparatus as in claim 11 wherein said mist inlet plate includes a conductive coating.

13. Apparatus as in claim 1 wherein said mist inlet plate is transparent to ultraviolet radiation.

14. Apparatus as in claim 1 and further including a source of said liquid precursor and liquid mass flow controller between said source and said mist generator.

15. Apparatus for fabricating an integrated circuit comprising:

(a) a mist generator for forming a mist of a liquid precursor;

(b) a velocity reduction chamber in fluidic communication with said mist generator;

(c) a deposition chamber;

(d) a substrate holder for supporting a substrate within said deposition chamber, said substrate holder defining a substrate plane and a substrate deposition area in said substrate plane;

(e) a mist inlet plate between said velocity reduction chamber and said deposition chamber, said mist inlet plate having a plurality of inlet ports defining an inlet plane substantially parallel to said substrate plane, the distance between said inlet ports being 0.020 inches or less measured edge-to-edge in said mist inlet plane; and (f) an exhaust port for withdrawing exhaust from said deposition chamber.

16. Apparatus as in claim 15 wherein said inlet ports are holes that are between 0.02 and 0.060 inches in diameter.

17. Apparatus as in claim 16 wherein said inlet ports are holes in said inlet plate that are substantially 0.040 inches in diameter.

18. Apparatus for fabricating an integrated circuit comprising:

(a) a mist generator for forming a mist of a liquid precursor;

(b) a deposition chamber;

(c) a substrate holder for supporting a substrate within said deposition chamber, said substrate holder defining a substrate plane and a substrate deposition area in said substrate plane;

(d) a mist inlet plate between said velocity reduction chamber and said deposition chamber, said mist inlet plate having a plurality of inlet ports defining an inlet plane substantially parallel to said substrate plane, said inlet ports distributed over an inlet port area of said inlet plate, the density of said inlet ports being at least 100 ports per square inch over said inlet port area, and said inlet port area being at least seven square inches; and (e) an exhaust port for withdrawing exhaust from said deposition chamber.

19. Apparatus as in claim 18 wherein said density of said inlet ports is at least 400 ports per square inch.

20. Apparatus as in claim 18 and further including a velocity reduction chamber located between said mist generator and said mist inlet plate.

21. Apparatus as in claim 20 wherein said mist inlet plate forms a partition between said velocity reduction chamber and said deposition chamber.

22. Apparatus as in claim 18 wherein said inlet plate is located substantially directly above said substrate whereby gravity assists said deposition of said mist on said substrate.

23. Apparatus as in claim 18 wherein said deposition chamber further includes a mist particle electrical accelerator for electrically accelerating mist particles in a direction substantially perpendicular to said substrate plane, and said inlet plate comprises an electrode of said electrical accelerator.

24. Apparatus as in claim 23 wherein said mist inlet plate includes a conductive coating.

25. Apparatus as in claim 18 wherein said mist inlet plate is transparent to ultraviolet radiation.

26. Apparatus for fabricating an integrated circuit comprising:

(a) a mist generator for forming a mist of a liquid precursor in a gas comprising one or more gases selected from the group consisting of oxygen and carbon dioxide;

(b) a deposition chamber in fluidic communication with said mist generator;

(c) a substrate holder for supporting a substrate within said deposition chamber, said substrate holder defining a substrate plane and a substrate deposition area in said substrate plane;

(d) a mist accelerator for electrically accelerating said mist in a direction substantially perpendicular to said substrate plane, and (e) an exhaust port for withdrawing exhaust from said deposition chamber.

27. Apparatus as in claim 26 and further comprising a mist inlet plate between said mist generator and said deposition chamber, said mist inlet plate having a plurality of inlet ports defining an inlet plane substantially parallel to said substrate plane, and said inlet plate comprising an electrode of said mist electrical accelerator.

28. Apparatus as in claim 26 and further comprising a velocity reduction chamber between said mist generator and said mist inlet plate.

29. Apparatus for fabricating an integrated circuit comprising:

(a) a deposition chamber for containing a substrate;

(b) a substrate holder located within said deposition chamber for supporting a substrate, said substrate holder defining a substrate plane;

(c) a mist generator in fluidic communication with said deposition chamber;

(d) said deposition chamber including: a mist particle electrical accelerator for electrically accelerating mist particles in a direction substantially perpendicular to said substrate plane;

(e) an electrical mist filter located between said mist generator and said mist particle electrical accelerator; and (f) an exhaust port for withdrawing exhaust from said deposition chamber.

30. Apparatus as in claim 29 wherein said electrical mist particle filter comprises a mesh made of conducting material.

31. Apparatus as in claim 30 wherein said mesh is located in the flow of said mist particles so that all mist particles must pass through said mesh.

32. Apparatus for fabricating an integrated circuit comprising:

(a) a source of a liquid precursor;

(b) a mist generator for forming a mist of a liquid precursor;

(c) a liquid mass flow controller between said source and said mist generator for controlling the flow of liquid precursor to said mist generator;

(d) a deposition chamber in fluidic communication with said mist generator;

(e) a substrate holder for supporting a substrate within said deposition chamber, said substrate holder defining a substrate deposition area in said substrate plane; and (f) an exhaust port for withdrawing exhaust from said deposition chamber.

* * * * *